(12) United States Patent
Choi

(10) Patent No.: US 9,012,950 B2
(45) Date of Patent: Apr. 21, 2015

(54) LIGHT EMITTING DEVICE PACKAGE

(75) Inventor: Sun Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 170 days.

(21) Appl. No.: 13/591,693

(22) Filed: Aug. 22, 2012

(65) Prior Publication Data

US 2013/0049049 A1 Feb. 28, 2013

(30) Foreign Application Priority Data

Aug. 22, 2011 (KR) .......................... 10-2011-0083477
Mar. 13, 2012 (KR) .......................... 10-2012-0025661

(51) Int. Cl.
| | | |
|---|---|---|
| H01L 33/00 | (2010.01) |
| H01L 27/15 | (2006.01) |
| H01L 29/161 | (2006.01) |
| H01L 33/58 | (2010.01) |
| H01L 33/48 | (2010.01) |
| H01L 25/075 | (2006.01) |
| H01L 33/38 | (2010.01) |
| H01L 33/50 | (2010.01) |

(52) U.S. Cl.
CPC .............. *H01L 33/58* (2013.01); *H01L 33/486* (2013.01); *H01L 25/0753* (2013.01); *H01L 33/382* (2013.01); *H01L 33/508* (2013.01); *H01L 2224/48091* (2013.01); *H01L 2224/48137* (2013.01); *H01L 2224/49107* (2013.01); *H01L 2224/8592* (2013.01)

(58) Field of Classification Search
CPC ......... H01L 33/58; H01L 33/60; H01L 33/54; H01L 2924/12041; H01L 2924/1815; H01L 51/5262; H01L 2924/15153; H01L 31/0203; H01L 31/0232; H01L 33/20; H01L 33/48; G02B 3/08; G02B 6/0021; G02B 6/0033
USPC ...................... 257/79, 81, 82, 84, 98, 99, 100
See application file for complete search history.

(56) References Cited

U.S. PATENT DOCUMENTS

| | | | |
|---|---|---|---|
| 2007/0030703 A1* | 2/2007 | Lee et al. ....................... 362/800 |
| 2008/0023714 A1* | 1/2008 | Chae et al. ....................... 257/98 |
| 2011/0216543 A1* | 9/2011 | Kayanuma ............... 362/311.01 |

FOREIGN PATENT DOCUMENTS

| | | |
|---|---|---|
| JP | 61147585 A | 7/1966 |
| KR | 1020060033438 A | 4/2006 |

\* cited by examiner

*Primary Examiner* — Chuong A Luu
*Assistant Examiner* — Cory Eskridge
(74) *Attorney, Agent, or Firm* — Sughrue Mion, PLLC

(57) ABSTRACT

A light emitting device package includes: a package main body having a chip mounting region surrounded by side walls; lead frames spaced apart from one another, at least one portion thereof being positioned in the chip mounting region; a light emitting device mounted on the chip mounting region; a wire connecting the lead frame and the light emitting device; a lens disposed on the light emitting device; and a lens support unit formed to be higher than the wire in the chip mounting region and supporting the lens such that the lens does not come into contact with the wire.

19 Claims, 22 Drawing Sheets

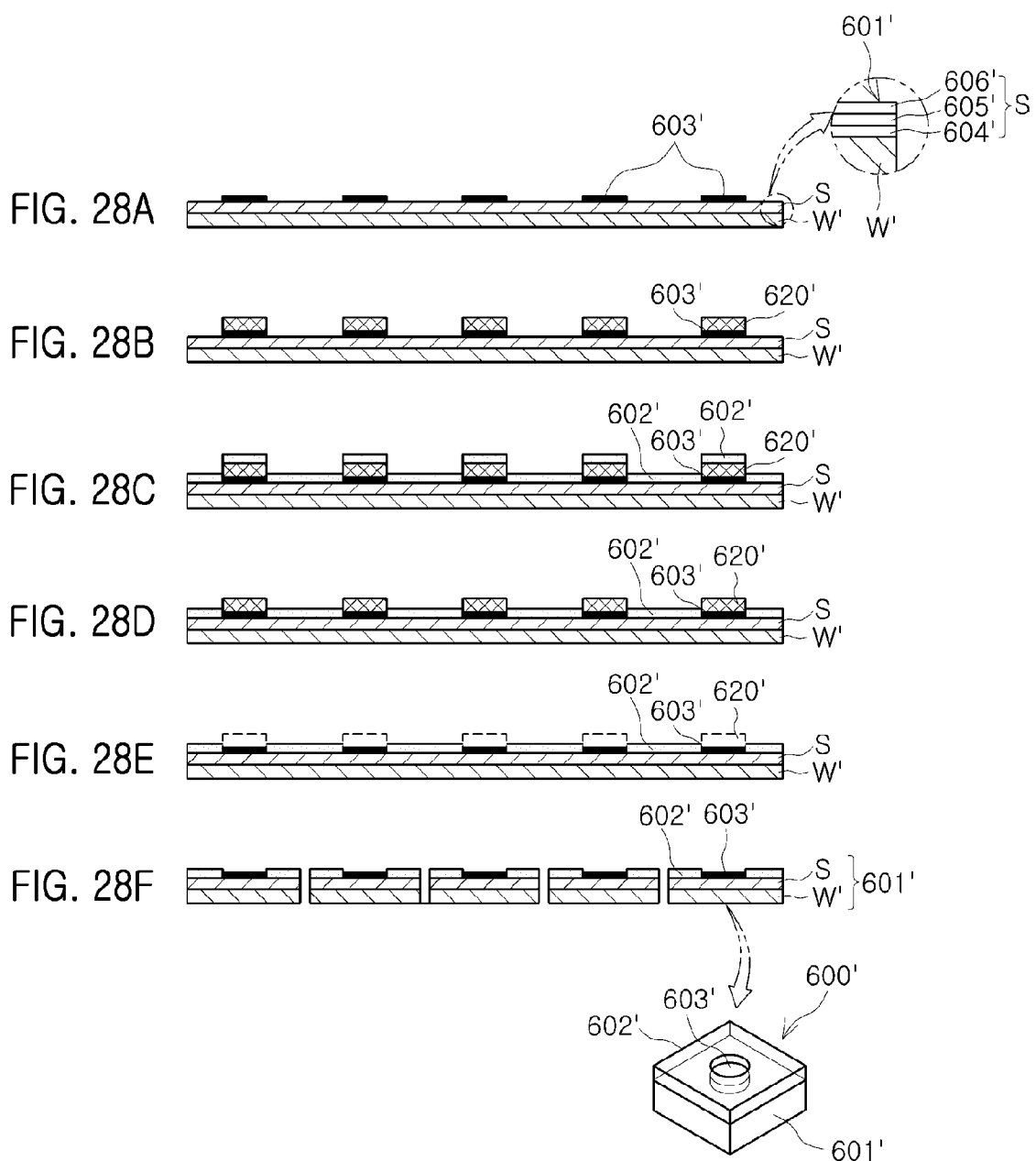

FIG. 30A
FIG. 30B
FIG. 30C
FIG. 30D
FIG. 30E
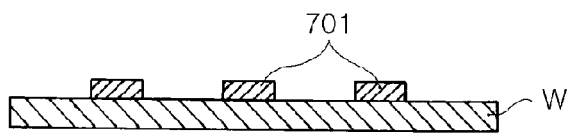
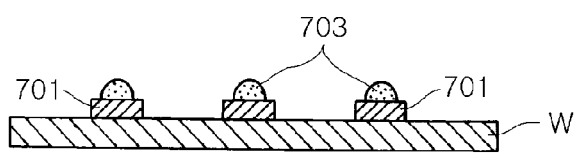
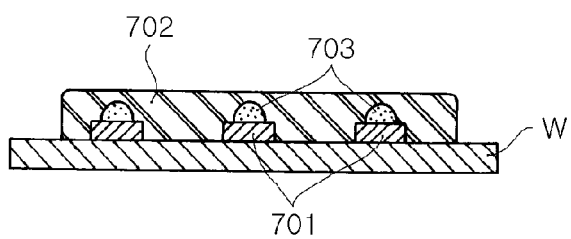
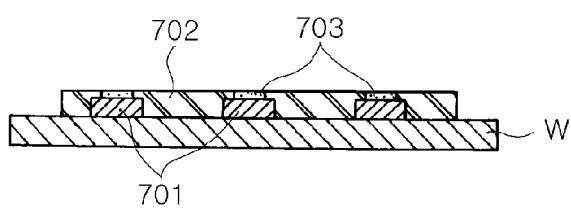
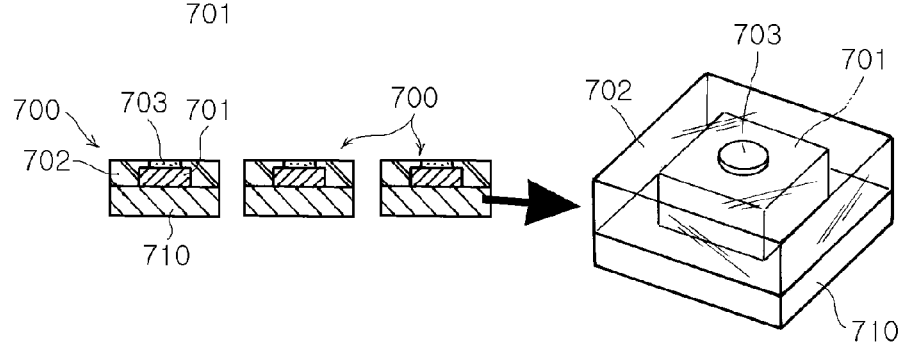

LIGHT EMITTING DEVICE PACKAGE

CROSS-REFERENCE TO RELATED APPLICATIONS

This application claims the priority of Korean Patent Applications No. 10-2011-0083477 filed on Aug. 22, 2011 and No. 10-2012-0025661 filed on Mar. 13, 2012, in the Korean Intellectual Property Office, the disclosures of which are incorporated herein by references.

BACKGROUND OF THE INVENTION

1. Field of the Invention

The present invention relates to a light emitting device package.

2. Description of the Related Art

A light emitting diode (LED), a semiconductor device capable of generating light of various colors according to electron hole recombination occurring in p-type and n-type semiconductor junctions when current is applied thereto, is environmentally-friendly, has a fast response time in the range of a few nano-seconds to thus be effective in displaying a video signal stream, and is available for impulsive driving.

Also, in order to enhance and device responsiveness and luminous intensity distribution, as well as providing a high level of reliability, an LED may be configured in the form of a package by installing the LED in a package main body.

Some LED packages are fabricated to have a lens provided at a light emission surface side, and such a lens serves to collect or disperse light emitted from an LED.

In the related art, a dome-type lens with a flat base plane and a convex upper portion has been commonly used, owing to ease of fabrication. However, the dome-type lens has a problem in which a wire electrically connecting an LED and a lead frame may be cut by contraction and expansion of the lens.

Meanwhile, recently, in line with the tendency for reductions in package size, a flat-type lens of which a reflector is protruded toward the interior of a package, having a structure allowing the lens to be easily picked up during a surface mounting technology (SMT) process, has been widely used.

Pick-up refers to mounting a lens on a package main body by using a pick-up device during a process of coupling the lens to the package main body, and at this time, a phenomenon occurs in which the lens is pressed downwardly due to pressure of a certain magnitude being applied to the device. This is because lenses are commonly made of a resin such as silicon, or the like, that does not have a high level of hardness, so they are readily deformed and flexible and a contact area between the package main body and the lens is not large.

Thus, when the lens is pressed downwardly during the pick-up process, a wire electrically connecting the LED of the package to a lead frame may be pressed by a lower end portion of the lens reflector and damaged or severed, resulting in a defect such as a short.

SUMMARY OF THE INVENTION

An aspect of the present invention provides a light emitting device package capable of avoiding potential damage to a wire resulting from a lens pressed in a process of installing a lens in a package main body, and a fabrication method thereof.

Another aspect of the present invention provides a light emitting device package capable of avoiding damage to a wire by minimizing an occurrence of a phenomenon in which the wire is affected by contraction and expansion of a lens or an encapsulation unit formed through molding.

According to an aspect of the present invention, there is provided a light emitting device package including: a package main body having a chip mounting region surrounded by side walls; lead frames spaced apart from one another, at least one portion thereof being positioned in the chip mounting region; a light emitting device mounted on the chip mounting region; a wire connecting the lead frame and the light emitting device; a lens disposed on the light emitting device; and a lens support unit formed to be higher than the wire in the chip mounting region and supporting the lens such that the lens does not come into contact with the wire.

The lens support unit may be formed on at least one portion among remaining portions after the light emitting device is mounted on the chip mounting region.

The lens support unit may have a stopping protuberance allowing a lower end portion of the lens to be caught thereby.

The stopping protuberance may have a hemispherical shape.

The stopping protuberance may have a square pillar shape.

The lens support unit may have a structure in which at least one part thereof extends from the side wall toward the light emitting device.

The lens support unit may have an opening hole penetrating the lens support unit in a portion thereof extending from the side wall and disposed in an upper space of the chip mounting region.

At least one of the plurality of lens support units may extend from one side wall and traverse the chip mounting region so as to be connected to the other side wall.

A plurality of lens support units may intersect each other in the chip mounting region.

A lower surface of the lens support unit may be positioned to be higher than the wire.

The side wall may have at least one support protuberance, and the lens may have at least one horizontal protrusion formed on an outer circumference thereof and supported by the support protuberance.

The side wall may have at least one indentation formed in an upper edge thereof, and the lens may have at least one insertion projection formed on an outer edge thereof such that it corresponds to the indentation in the side wall.

The package main body may include a support protuberance formed on an inner side of the side wall and a recess portion having the chip mounting region at an inner side of the support protuberance, wherein the recess portion may be formed to have a depth from which the wire is not protruded upwardly and an upper surface of the support protuberance may be positioned to be higher than the wire.

One portion of the lens support unit may be fixedly placed on the support protuberance, and the other remaining portion may be placed over the recess portion and disposed above the chip mounting region.

A lower surface of the lens support unit may be coplanar with an upper surface of the support protuberance.

The light emitting device package may further include an encapsulation unit filling the recess portion to encapsulate the light emitting device and the wire.

The encapsulation unit may contain at least one type of phosphor.

The lens may be formed such that an upper surface thereof is flat and a lower portion thereof is protuberant.

The lens may be formed such that a lower surface thereof is flat.

The lens may be formed such that a lower surface thereof has a Fresnel lens shape.

According to another aspect of the present invention, there is provided a method of fabricating a light emitting device package, including: preparing a package main body by forming side walls to have a chip mounting region therein, forming a lens support unit adjacent to the chip mounting region, and installing first and second lead frames such that they are spaced apart from one another, at least one portion thereof being positioned in the chip mounting region; mounting a light emitting device on a region of the first lead frame exposed to the chip mounting region; connecting the second lead frame and the light emitting device by a wire; installing a lens on the lens support unit such that the lens does not come into contact with the wire, wherein the lens support unit is formed to be higher than the wire.

The lens support unit may have a stopping protuberance allowing a lower end portion of the lens to be caught thereby.

The package main body may be separated from a mold by using the lens support unit as an eject pin support unit so as to be fabricated.

A space between the light emitting device and a lower surface of the lens may be adjusted by adjusting the height of the lens support unit.

The lens may be formed such that an upper surface thereof is flat and a lower portion thereof is protuberant.

The lens may be formed such that a lower surface thereof is flat.

The lens may be formed such that a lower surface thereof has a Fresnel lens shape.

According to another aspect of the present invention, there is provided a method of fabricating a light emitting device package, including: preparing a package main body by forming a recess portion to have a chip mounting region provided therein, forming a support protuberance to have the recess portion at an inner side thereof, forming a side wall to have the support protuberance at an inner side thereof, and installing first and second lead frames such that they are spaced apart from one another, at least one portion thereof being exposed to the chip mounting region; mounting a light emitting diode (LED) device on a region of the first lead frame exposed to the chip mounting region; connecting the second lead frame and the light emitting device by a wire; providing a lens support unit such that a portion thereof is placed on the support protuberance so as to be supported and the other remaining portion is placed over the recess portion and disposed above the chip mounting region; and providing a lens on the support protuberance and the lens support unit, wherein the lens support unit is formed to be higher than the wire.

The method may further include: forming an encapsulation unit by injecting a molding resin into the recess portion to encapsulate the LED device and the wire, before providing the lens support unit.

A lower surface of the lens support unit may be coplanar with an upper surface of the support protuberance.

BRIEF DESCRIPTION OF THE DRAWINGS

The above and other aspects, features and other advantages of the present invention will be more clearly understood from the following detailed description taken in conjunction with the accompanying drawings, in which:

FIGS. 28A to 28F are views schematically illustrating sequential processes of fabricating an LED device according to another embodiment of the present invention;

FIGS. 30A to 30E are views schematically illustrating sequential processes of fabricating an LED device according to another embodiment of the present invention.

DETAILED DESCRIPTION OF THE PREFERRED EMBODIMENT

Figure 1:
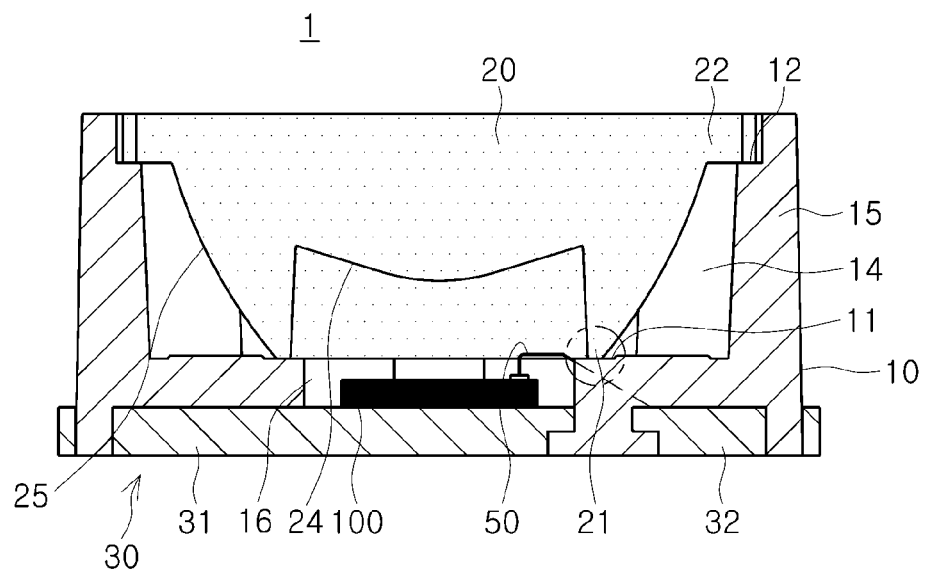
FIG. 1 is a cross-sectional view schematically illustrating a light emitting device package according to an embodiment of the present invention.

Embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

Figure 2:
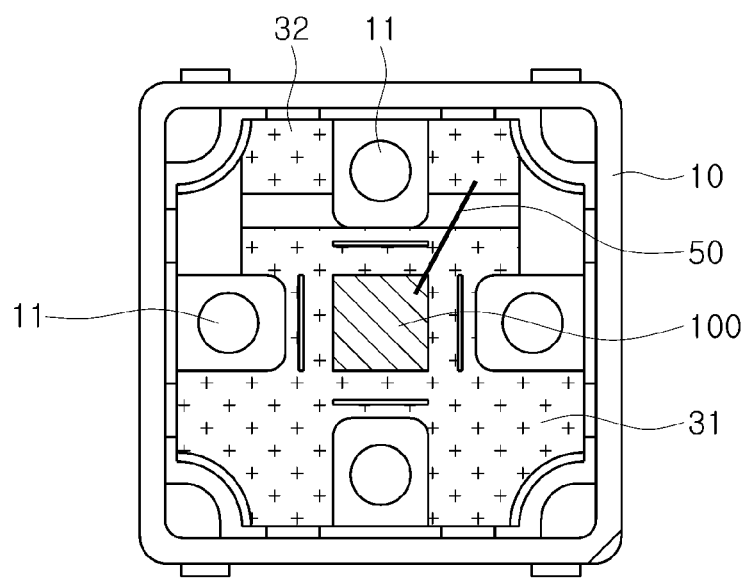
FIG. 2 is a plan view of FIG. 1.

A light emitting device package according to an embodiment of the present invention will be described with reference to FIGS. 1 and 2. FIG. 1 is a cross-sectional view schematically illustrating a light emitting device package according to an embodiment of the present invention, and FIG. 2 is a plan view of FIG. 1.

The light emitting device package 1 according to the present embodiment may include a package main body 10 having a recess portion 14 including a chip mounting region 16 therein, a lead frame 30 having a portion exposed to the chip mounting region 16, a light emitting diode (LED) device 100 as an LED mounted on the region of the lead frame 30 exposed to the chip mounting region 16, a wire 50 electrically connecting the lead frame 30 and the LED device 100, and a lens 20 disposed in the recess portion 14 upwardly of the LED device 100.

In the package main body 10, a lens support unit 11 is provided at a portion remaining after the LED device 100 is mounted in the chip mounting region 16 of the recess portion 14, such that the lens support unit 11 is formed to be higher than the wire 50 in order to support a lower end portion of the lens 20. In the present embodiment, the lens support unit 11 is illustrated to extend from a wall body (to be described later) of the package main body 10, but, if necessary, the lens support unit 11 may be formed to be separated from the wall body.

Namely, the lens support unit 11 is formed to be higher than the wire 50 to support a lower end of a reflective region protruded from a lower portion of the lens 20, thereby preventing the wire 50 from being pressed by the lower end portion of the lens even if the lens 20 is pressed by a pick-up device.

The package main body 10 may be made of an insulating material such as plastic, silicon, a ceramic resin, or the like, which has excellent heat dissipation performance and light reflectivity as well as insulating characteristics to prevent an electrical short. Preferably, the package main body 10 may have a structure including a transparent resin and light reflecting particles (e.g., $TiO_2$) dispersed in the transparent resin. However, the material used for making the package main body 10 is not particularly limited thereto.

Also, the package main body 10 may have a vertical side wall 15 formed at the circumference thereof such that the recess portion 14 is formed. The side wall 15 may have a reflective layer (not shown) reflecting light output from the LED device 100 toward the lens 20 disposed upwardly thereof to thus minimize a light loss. The reflective layer may be formed by coating at least one of highly reflective metals such as Ag, Ni, Al, Rh, Pd, Ir, Ru, Mg, Zn, Pt, Au, or a mixture thereof on an inner surface of the side wall 15 or attaching a reflective sheet made of one of the metals or a mixture of two or more of the metals on the inner surface of the side wall 15.

The lead frame 30 may include a plurality of lead frames; first and second lead frames 31 and 32. The first and second lead frames 31 and 32 may be made of a metal, e.g., gold (Au), silver (Ag), copper (Cu), or the like, having excellent electrical conductivity and thermal conductivity properties, and may be disposed to the left and right on the package main body 10 such that they are spaced apart from each other.

One ends of the first and second lead frames 31 and may become a lead electrically connected to the LED device 100 and the other end thereof, being in contact with, for example, a circuit pattern, or the like, of a substrate (not shown) may be electrically connected to the circuit pattern so as to become a base unit as a bonding region provided as a surface mounting region applying external electrical signal. In this case, a portion of a lower surface of the first and second lead frames 31 and 32 may be exposed from a lower portion of the package main body 10 so as to be provided as a bonding region of the surface mounting region.

The LED device 100 is a diode which includes a junction structure such as p-n, n-p-n, or the like, and emits light when injected electrons or holes are recombined. In the present embodiment, one of a range of LED devices, such as a red LED device, a green LED device, a blue LED device, a white LED device, a yellow LED device, or a UV LED device, may be employed as the LED device 100.

In the present embodiment, it is illustrated that the LED device 100 is installed on the first lead frame 31, but, if necessary, two or more LED devices 100 may be installed on the single chip mounting region 16 in order to enhance luminance.

Also, in the present embodiment, the LED device 100 is directly electrically connected to the first lead frame 31 when it is mounted thereon and connected to the second lead frame 32 through the wire 50, but the connection method for connecting the LED device 100 and the lead frame is not limited thereto and may be variably modified. For example, according to an embodiment, the LED device 100 may be electrically connected to the first lead frame 31 through a wire. The LED device 100 will be described in detail later.

The lens 20 employed in the present embodiment may be made of a transparent or translucent material, preferably, a resin such as silicon, epoxy, or the like, in order to allow light from the LED device 100 to be emitted upwardly. As for a shape of the lens 20, the lens 20 may be configured as a so-called flat-top lens having a reflective portion with a flat upper surface and a convex lower portion.

Here, the lens 20 may include a reflective surface 24 controlling light output from an upper front surface of the LED device 100 and a total-reflective surface 25 controlling light output from a lateral side of the LED device 100.

The refractive surface 24 may have a flat or convex lower surface, serving to control light from the LED device 100 to be refracted at a certain angle so as to be reflected to an output surface. In this case, the lower surface of the refractive surface 24 may have a Fresnel lens shape allowing light to be further concentrated on the output surface.

The total reflective surface 25 may be formed to be curved or non-curved. When the total reflective surface 25 is formed to be curved, preferably, it is formed to have a conical surface or aspherical surface. The total reflective surface 25 may control light output from the lateral side of the LED device 100 such that it is total-reflected to thus concentrate light output in a forward direction.

The lens 20 includes at least one horizontal protrusion 22 formed on an outer circumferential surface thereof and having at least one flat surface. The horizontal protrusion 22 is mounted on each support protuberance 12 formed on an inner side of a side wall of the package main body 10 and coupled to the package main body 10 by using an adhesive, or the like. However, a coupling method for coupling the lens 20 and the package main body 10 is not limited to such a bonding method and may be variably modified according to a shape and size of the package main body 10 and the lens 20.

Meanwhile, one of the key factors in determining the optical characteristics of the light emitting device package 1, including the lens 20, is an interval between the LED device 100 emitting light and the lens 20 generating refraction of light, namely, an air gap. As for the air gap, an optimal interval is determined through experimentation in order to emit light, irradiated to the outside, at a certain emission angle to thus optimize luminance efficiency.

Thus, in order to maximize efficiency of front and lateral light output from the LED device 100, an appropriate interval of the air gap is required between the LED device 100 and a spatial height of the refractive surface 24 of the lens 10.

The reason is because, if the air gap is too small, light output from the lateral side of the LED device 100 is made incident to the refractive surface so as to be made incident to the outside of the output surface, increasing loss of light, so a numerical value of the air gap when the light emitting device package 1 was designed should be maintained or should not be reduced to be smaller at least to properly exhibit optical characteristics of the product.

In this respect, however, when the lens 20 is pressed by a pick-up device during a process of coupling the lens 20 and the package main body 10, the determined numerical value of the air gap is changed by the pressed numerical value, resulting in optical characteristics of the light emitting device package 1 being changed to be different from those of the light emitting device package 1 when it was designed.

However, in the present embodiment, since the lens support unit 11 is formed to be higher than the wire 50 to support the lower end of the reflector protruded from a lower portion of the lens 20, even in the case that the lens 20 is pressed by the pick-up device, the air gap between the refractive surface 24 of the lens 20 and the LED device 100 can be uniformly maintained.

Namely, in the present embodiment, the lens support unit 11 prevents the lens 20 from being pressed by the pick-up device to thereby prevent a change in the air gap between the LED device 100 and the lens 20, thus maintaining the optical characteristics determined when the light emitting device package 1 was designed.

Meanwhile, in the present embodiment, the chip mounting region 16 as a concave portion may be provided in the recess portion 14 of the package main body by the presence of the lens support unit 11, and an encapsulation unit (not shown) may be formed on the chip mounting region 16 to cover the LED device 100 to protect the LED device 100 and implement refractive index matching between a material of the LED device 100 and the outside to enhance external light extraction efficiency.

The encapsulation unit may be formed by applying a translucent resin such as silicon or epoxy. Also, the encapsulation unit may include phosphors to convert a color of light emitted from the LED device 100 to various colors.

Also, the encapsulation unit may include quantum dots.

Figure 3:
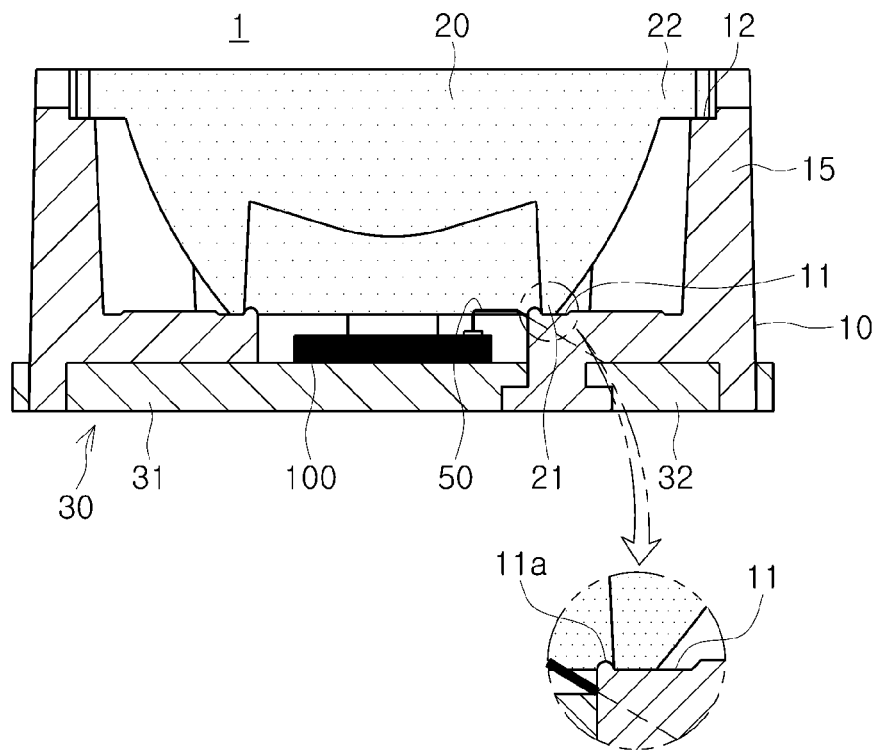
FIG. 3 is a cross-sectional view schematically illustrating a light emitting device package according to another embodiment of the present invention.
Figure 4:
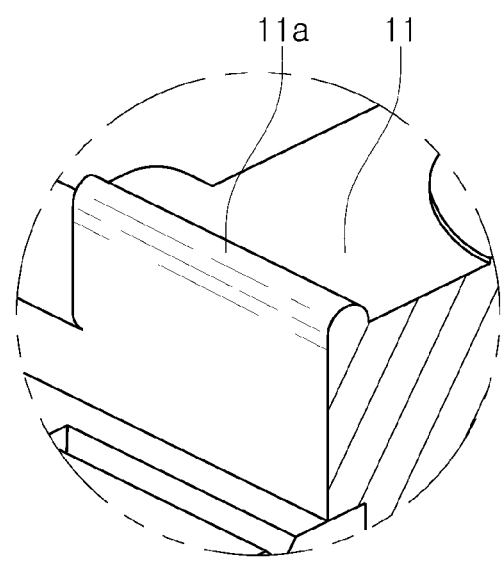
FIG. 4 is an enlarged perspective view of a lens support unit of FIG. 3.

With reference to FIGS. 3 and 4, in a modification of the lens support unit 11, a stopping protuberance 11a may be formed to be upwardly protruded such that a lower end portion of the lens 20 is caught by the end portion of the lens support unit 11 to fix the position (namely, the position in a vertical direction) of the lens 20. Here, the stopping protuberance 11a may have a hemispherical shape, a square pillar shape, or the like, and may be formed to extend along an outer circumferential surface of the lower end portion of the lens 20. Here, the stopping protuberance 11a may be modified to have any shape so long as it can support the lower end portion of the lens 20 to fix the position of the lens 20.

Figure 5:
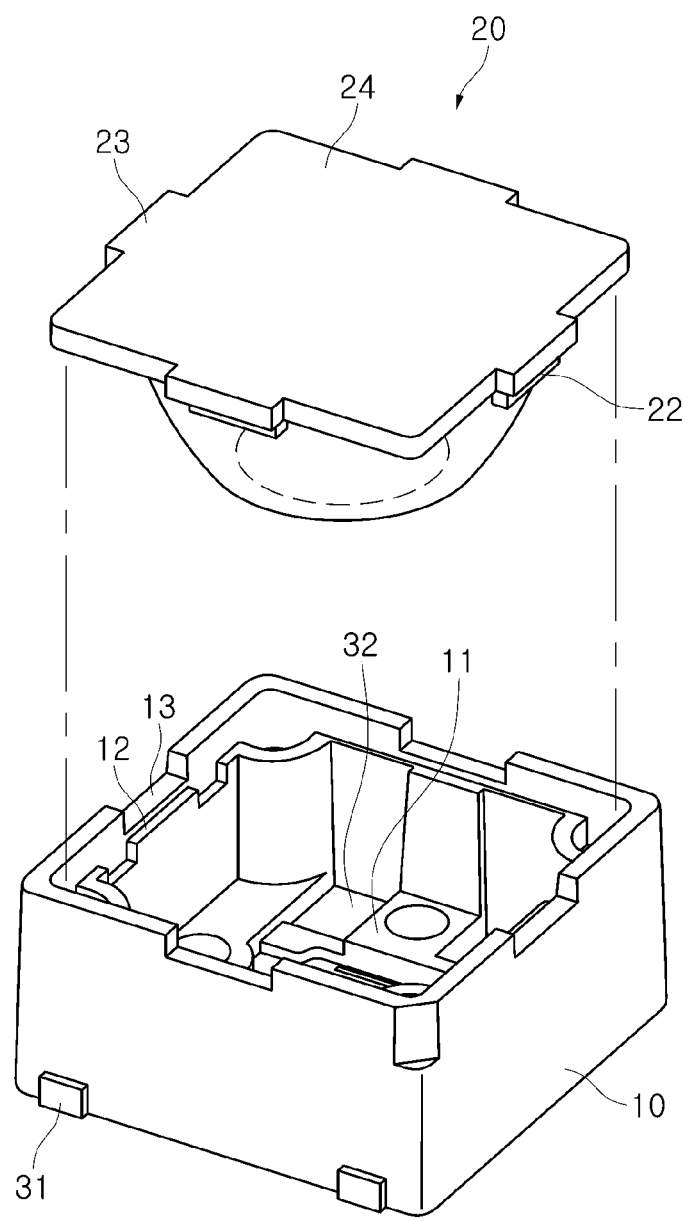
FIG. 5 is an exploded perspective view schematically illustrating a state in which a package main body and a lens of a light emitting device package are separated according to another embodiment of the present invention.
Figure 6:
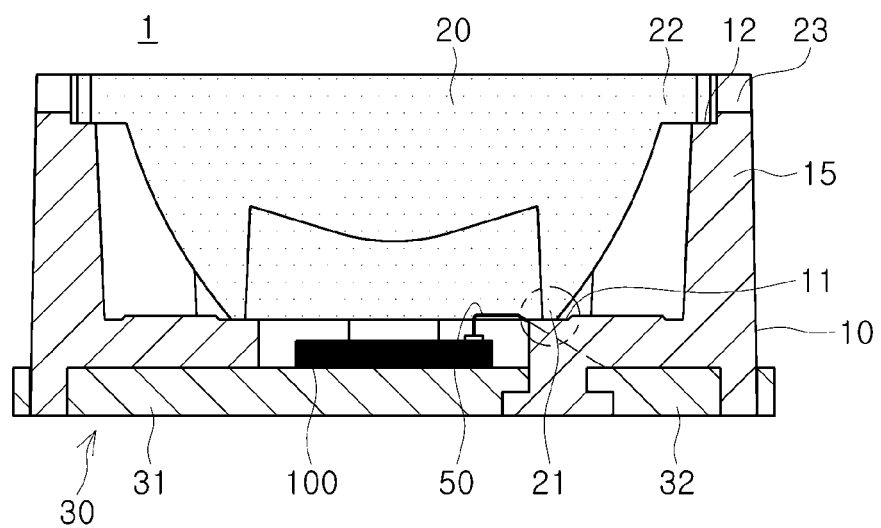
FIG. 6 is a side sectional view of FIG. 5.

With reference to FIGS. 5 and 6, in a modification of the package main body 10 and the lens 20, the package main body 10 may have at least one indentation (i.e., a depression) 13 formed in an upper part of the side wall 15, and the lens 20 may include insertion projections formed to be flatly protruded from an upper end thereof such that the insertion projections correspond to the indentations 13. Accordingly, in coupling the lens 20 to the package main body 10 using a pick-up device (not shown), the insertion projections 23 are inserted into the indentations 13 to precisely set front, rear, left, and right positions of the lens 20, thus restraining mobility.

Namely, optical characteristics may be changed according to the positions of the coupled lens 20 and package main body 10, and in this case, since the positions of the lens 20 and the package main body 10 in x, y, and z axes are fixed and fabricated through the coupling structure of the insertion projections 23 and the indentations 13, the lens can retain the characteristics present when the light emitting device package 1 was designed, after the light emitting device package 1 is fabricated.

A method of fabricating the light emitting device package 1 according to an embodiment of the present invention configured as described above will be described as follows.

First, the package main body 10 is prepared by using a mold. The package main body 10 is prepared such that the side wall 15 is formed to allow the recess portion including the chip mounting region 16 therein to be formed at an inner side of the package main body 10, and the lens support unit 11 formed to be higher than the wire and adjacent to the chip mounting region 16 of the recess portion 14.

Here, in the case of the light emitting device package 1 using a flat-type lens, it is largely used as illumination source of a camera flash, or the like, and the LED device used for such a purpose emits light only from an upper surface thereof, and thus, the formation of the lens support unit 11 does not mar luminous efficiency.

Also, in the process of preparing the package main body 10, first and second lead frames 31 and 32 are installed together such that they are spaced apart from one another and at least portions thereof are exposed to the chip mounting region 16.

The LED device 100 is mounted on the region of the first lead frame exposed to the chip mounting region 16, and the second lead frame 32 and the LED device 100 are electrically connected through the wire 50.

Thereafter, the lens 20 is installed above the LED device 100 by using a pick-up device (not shown). At this time, the horizontal protrusion 22 of the lens 20 is supported by the outer circumferential surface of the support protuberance 12 of the side wall 14, and the lower end portion of the lens 20 is supported by the lens support unit 11, whereby the wire 50 is prevented from being pressed by the lower end portion of the lens 20 by the pressure of the pick-up device.

Meanwhile, in the operation of preparing the package, the package main body 10 is fabricated by using a plurality of cavities in a mold, and in this case, an eject pin for pushing the lead frame 30 of the package main body 10 may be used in order to allow the package main body 10 to be easily separated from the mold.

Namely, the use of the eject pin facilitates the separation of the package main body 10 from the mold, and as the size of the eject pin is increased, the package main body 10 can be more easily separated from the mold. To this end, thus, a space for the eject pin is required in the package main body 10, but, recently, as the packages have been reduced in size, securing space for such an eject pin has become problematic, making it difficult to apply the eject pin.

However, in the present embodiment, the lens support unit 11 may be utilized as a space for the eject pin, achieving an effect in which the package main body 10 can be stably separated from the mold, even in the case that the size of the package is reduced. Also, through such a process, a defect rate during the mold separation process can be further reduced.

A light emitting device package according to another embodiment of the present invention will be described with reference to FIGS. 7 through 10.

Figure 7:
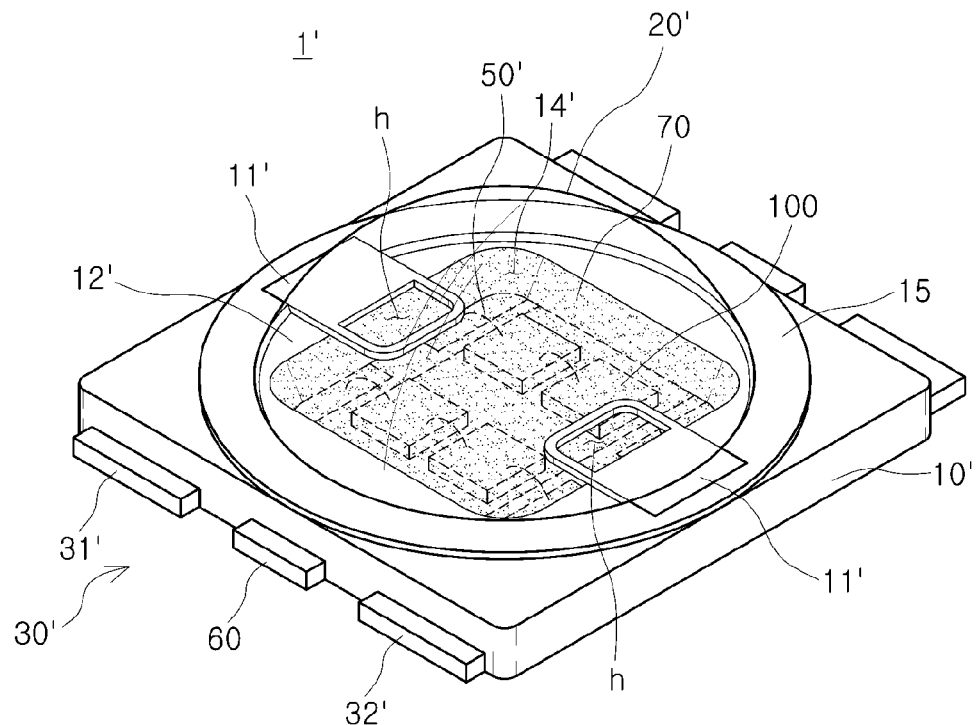
FIG. 7 is a perspective view schematically illustrating a light emitting device package according to another embodiment of the present invention.
Figure 8:
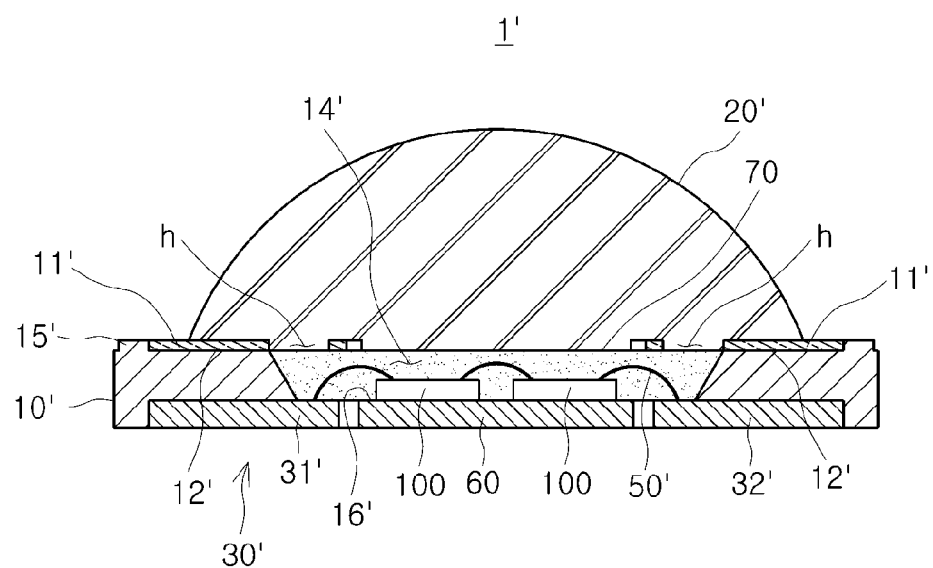
FIG. 8 is a sectional view of FIG. 7.
Figure 9A:
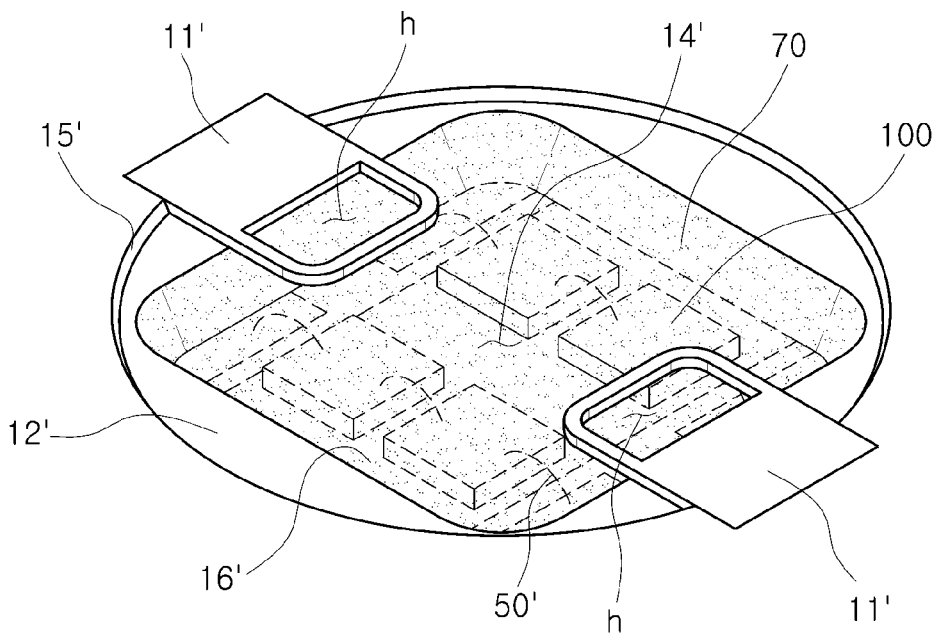
FIGS. 9A and 9B are an enlarged perspective view and an enlarged cross-sectional view of a lens support unit in FIG. 7.
Figure 9B:
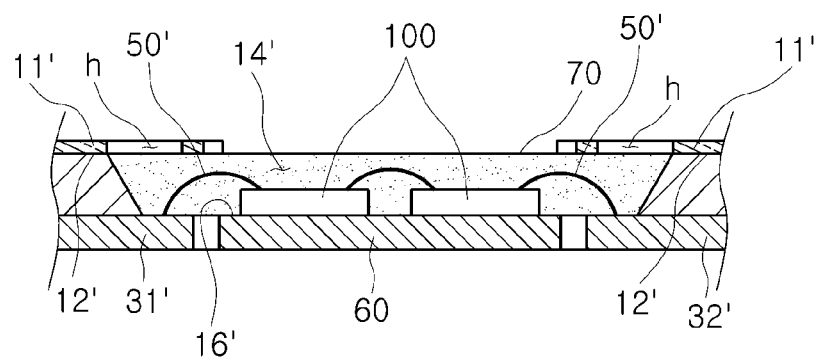
Figure 10:
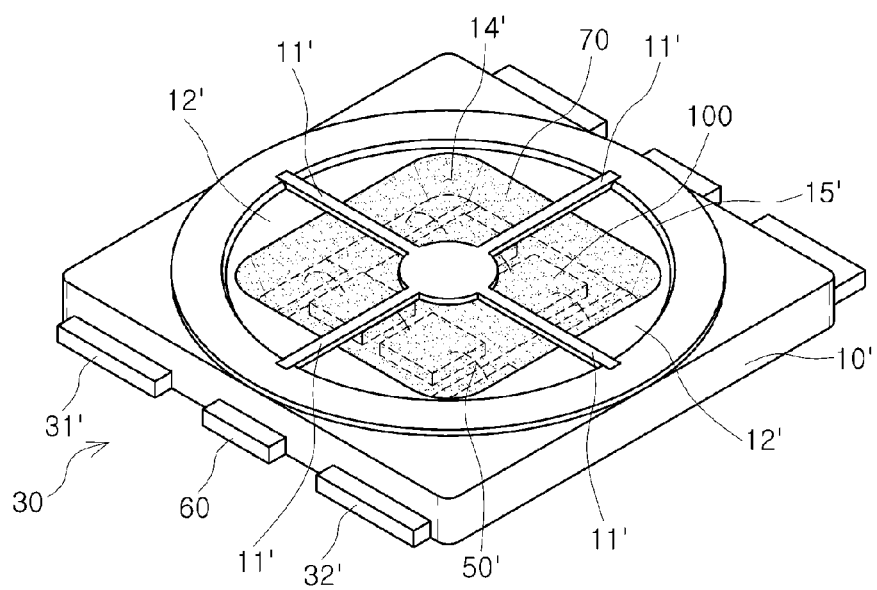
FIG. 10 is a perspective view schematically illustrating another example of a lens support unit in the light emitting device package of FIG. 7.
Figure 11:
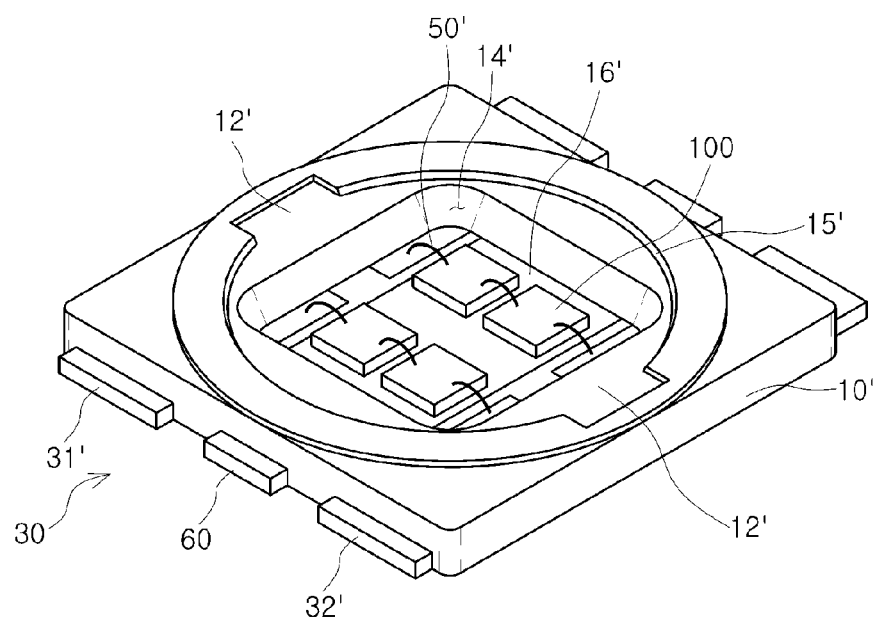
FIGS. 11 through 14 are views schematically illustrating sequential processes of fabricating the light emitting device package of FIG. 7.

FIG. 7 is a perspective view schematically illustrating a light emitting device package according to another embodiment of the present invention. FIG. 8 is a sectional view of FIG. 7. FIGS. 9A and 9B are an enlarged perspective view and an enlarged cross-sectional view of a lens support unit in FIG. 7. FIG. 10 is a perspective view schematically illustrating another example of a lens support unit in the light emitting device package of FIG. 7.

With reference to FIGS. 7 and 8, a light emitting device package 1' according to the present embodiment may include a package main body 10' having a recess portion 14' including a chip mounting region 16' therein, a lead frame 30' having a portion exposed to the chip mounting region 16', a light emitting diode (LED) device 100 mounted on the chip mounting region 16', a wire 50' electrically connecting the lead frame 30' and the LED device 100, a lens 20' disposed in the recess portion 14' upwardly of the LED device 100, and a lens support unit 11' supporting the lens 20' such that the wire 50' and the lens 20' do not come into contact with each other.

The LED device 100 is a diode which includes a junction structure such as p-n, n-p-n, or the like, and emits light when injected electrons or holes are recombined.

In the present embodiment, one of a range of LED devices, such as a red LED device, a green LED device, a blue LED device, a white LED device, a yellow LED device, or a UV LED device, may be employed as the LED device 100. The LED device 100 will be described in detail later.

The package main body 10' may be made of an insulating material such as plastic, silicon, a ceramic resin, or the like, which has excellent heat dissipation performance and light reflectivity as well as insulating characteristics to prevent an electrical short. Preferably, the package main body 10 may have a structure including a transparent resin and light reflecting particles (e.g., TiO$_2$) dispersed in the transparent resin. However, the material used for making the package main body 10' is not particularly limited thereto.

The package main body 10' may have a vertical side wall 15' provided at the circumference thereof to form a support protuberance 12' supporting the lens 20'. The support protuberance 12' may have a structure having a step formed to have a certain depth downwardly from an upper surface of the side wall 15' in an inner side of the side wall 15'. The support protuberance 12' may have the recess portion 14' formed to be depressed to have a certain depth from the surface from the support protuberance 12' at an inner side of the support protuberance 12'.

The recess portion 14' may have a space having a size sufficient for accommodating the LED device 100 therein and have such a depth as to prevent the wire 50' connecting the LED device 100 to the lead frame 30' from being upwardly protruded. Thus, an upper surface of the support protuberance 12' having the recess portion 14' may be positioned to be higher than the wire 50'. The recess portion 14' may have a structure in which an inner lateral surface thereof is sloped to reflect light, output from the LED device 100, toward the lens 20' to thus minimize a loss of light. A reflective layer (not shown) having excellent light reflectivity may be further formed on the inner lateral surface.

The reflective layer may be formed by coating at least one of highly reflective metals such as Ag, Ni, Al, Rh, Pd, Ir, Ru, Mg, Zn, Pt, and Au, or a mixture thereof on an inner surface of the recess portion 14' or attaching a reflective sheet made of one of the metals or a mixture of two or more of the metals on the inner surface of the recess portion 14'. The recess portion 14' may have the chip mounting region 16' at the center thereof on which the LED device 100 is mounted.

The lead frame 30' may include a plurality of lead frames; first and second lead frames 31' and 32'. The first and second lead frames 31' and 32' may be disposed to the left and right on the package main body 10' such that they are spaced apart from each other. The lead frame 30' may be made of a metal, e.g., gold (Au), silver (Ag), copper (Cu), or the like, having excellent electrical conductivity and thermal conductivity properties, but the material of the lead frame 30' is not limited thereto.

Portions of the first and second lead frames 31' and 32' may be exposed to the chip mounting region 16' to become leads electrically connected to the LED device 100 and a portions of opposite sides of the first and second lead frames 31' and 32' are protruded to the outside of the package main body 10' so as to be in contact with, for example, a circuit pattern (not shown), or the like, of a mounting substrate (not shown) and electrically connected thereto so as to become a base unit in a bonding region applying an external electrical signal. In this case, the first and second lead frames 31' and 32' may be exposed from a lower portion of the package main body 10' so as to be provided as a bonding region of the surface mounting region.

In the present embodiment, it is illustrated that the first and second lead frames 31' and 32' are disposed as a pair to be spaced apart and do not contact each other, but the present invention is not limited thereto. Namely, like the embodiment of FIG. 1, a single first lead frame 31' and a single second lead frames 32' may be provided and disposed to the left and right with a certain interval therebetween on the package main body 10'. In this case, both end portions of the first lead frame 31'and both end portions of the second lead frame 32' are protruded to the outside of the package main body 10', and portions of the central regions of the first and second lead frames 31' and 32' are exposed to the chip mounting region 16'.

As shown in FIGS. 7 and 8, at least one of LED device 100 may be mounted on the chip mounting region 16' within the recess portion 14'. In detail, the LED devices 100 are disposed to be spaced apart from each other between the first and second lead frames 31' and 32', and may be fixedly mounted on a heat dissipation unit 60 exposed to the chip mounting region 16'. The heat dissipation unit 60 is made of a material having excellent thermal conductivity and includes a heat sink. Like the lead frame 30', the heat dissipation unit 60 may be exposed to a lower portion of the package main body 10', and accordingly, heat dissipation efficiency can be enhanced. The LED device 100 may be electrically connected to the first and second lead frames 31' and 32' by the medium of a conductive wire 50'.

In the present embodiment, it is illustrated that a plurality of LED devices 100 are installed and arranged on the chip mounting region 16', but the present invention is not limited thereto, and only a single LED device 100 may be installed as necessary.

Also, in the present embodiment, the heat dissipation unit 60 and the lead frames 30' are spaced apart from one another and are not in contact with each other. However, the heat dissipation unit 60 may be integrally connected to any one of the first lead frame 31' and the second lead frame 32'. For example, when the heat dissipation unit 60 is integrally formed with the first lead frame 31', the LED device 100 may be physically joined and electrically connected to the heat dissipation unit 60 by the medium of a conductive adhesive layer and may be connected to the second lead frame 32' through the wire 50'.

At least one lens support unit 11' extends from the side wall 15' toward the LED device 100. The lens support units 11' are formed to be higher than the wire 50' at the chip mounting region 16'. The lens support units 11' support the lens 20' such that the lens 20' does not come into contact with the wire 50' when coupled to the package main body 10'.

As illustrated in FIG. 9, portions of the lens support units 11' are fixedly mounted on the support protuberance 12' and the other remaining portions thereof are placed on the recess portion 14' and disposed in an upper space of the chip mounting region 16'. Namely, the lens support units 11' are placed on the support protuberance 12' and supported, and thus, lower surfaces of the lens support units 11' are positioned to be higher than the wire 50' to thus prevent the lens 20' supported by the lens support units 11' from coming into contact with the wire 50'. In this case, the lower surfaces of the lens support units 11' may be coplanar with an upper surface of the support protuberance 12'.

The lens support units 11' are disposed over the recess portion 14' in which light generated from the LED device 100 is emitted, so, in order to prevent a degradation of luminance efficiency, preferably, the lens support units 11' are made of a material such as transparent plastic (transparent PC), or the like. In particular, the lens support units 11' may have an opening hole (h) penetrating therethrough in a portion thereof placed over the recess portion 14'. Thus, although portions of the lens support units 121' are protruded from the support protuberance 12' to the upper space of the chip mounting region 16', the recess portion 14' can be exposed through the opening hole (h), whereby a region covered by the lens support units 11' can be minimized, and thus, a degradation of light extraction efficiency can be prevented.

Meanwhile, as illustrated in FIG. 10, the lens support units 11' may have a structure in which at least one lens support unit 11' extends from one side of any of the side walls 15', traverse the chip mounting region 16', and is connected to the other side. In detail, both ends of the lens support units 11' are fixedly placed on both of opposed support protuberances 12' across the recess portion 14', having the structure in which the lens support units 11' are laid across the upper space of the chip mounting region 16'. A plurality of lens support units 11' may be disposed to intersect each other over the chip mounting region 16' Accordingly, the lens 20' supported by the lens support units 11' are not bright into contact with the wire 50'.

In the present embodiment, it is illustrated that a pair of lens support units 11' are disposed to face each other or are disposed to intersect each other, but the present invention is not limited thereto and various numbers of lens support units 11' may be provided and the lens support units 11' may be disposed to have various structures.

The recess portion 14' is filled with a transparent epoxy region, or the like, to form an encapsulation unit 70 encapsulating the LED device 100 and the wire 50'. The encapsulation unit 70 filling the recess portion 14' may be formed such that an upper surface thereof is parallel to the upper surface of the support protuberance 12'.

The encapsulation unit 70 may contain at least one type of phosphor. In this case, the phosphor contained in the encapsulation unit 70 may be different to that of a phosphor included in a wavelength conversion unit formed in the LED device 100 (to be described later). The phosphor (e.g., a green phosphor or a blue phosphor) contained in the encapsulation unit 70 may be a phosphor emitting light having a shorter wavelength. Namely, the wavelength conversion unit containing a phosphor emitting light having a relatively long wavelength is positioned to be closest to the LED device 100, while the phosphor emitting light having a relatively short wavelength is formed on the wavelength conversion unit so as to be relatively distant from the LED device 100, thereby improving overall wavelength conversion efficiency of the LED device 100.

The lens 20' employed in the present embodiment may be made of a transparent or translucent material, preferably, a resin such as silicon, epoxy, or the like, allowing light emitted from the LED device 100 to be discharged upwardly, and may be configured as a dome lens with a convex upper surface.

The lens 20' may be mounted on an upper surface of the encapsulation unit 70 filling the recess portion 14' and the support protuberance 12' formed at the inner side of the side walls 15' of the package main body 10' and fixed through an adhesive, or the like. However, the method of coupling the lens 20' and the package main body 10' is not limited to such a bonding method, and the lens 20' may be directly formed on the package main body 10' through injection molding using a mold (not shown).

Meanwhile, an influence of contraction and expansion caused by a change in external temperature in the package main body 10' having the lens 20' is the biggest in a coupling interface between the lens 20' and the package main body 10'. Namely, according to a difference in strain between the lens 20' and the package main body 10', stress generated in the coupling interface separates the lens 20' from the package main body 10' and even effects the wire 50' within the encapsulation unit 70, causing the wire 50' to be separated from the LED device 100 due to accumulated plastic strain.

However, in the present embodiment, since the lens support units 11' are formed to be higher than the wire 50' to support the lens 20' in the coupling interface between the lens 20' and the package main body 10', thus minimizing an influence caused by the difference in the strain to prevent a separation of the lens 20' and minimizing the accumulated plastic strain acting on the wire 50' to prevent a separation of the wire 50'. Also, in bonding the lens 20', even in the case that the lens 20' is pressed by a pick-up device, since the lens 20' is prevented from pressing the wire 50' by virtue of the lens support units 11', product reliability can be enhanced.

FIGS. 11 through 14 are views schematically illustrating sequential processes of fabricating the light emitting device package of FIG. 7.

First, the package main body 10' is prepared by using a mold. The package main body 10' is prepared such that the side wall 15' is formed to have the support protuberance 12' at an inner side thereof and the recess portion 14' is formed to have the chip mounting region 16' at an inner side of the support protuberance 12'. Also, in the package main body 10', the first and second lead frames 31' and 32' are formed to be spaced apart from one another such that at least one portion thereof is exposed, and the heat dissipation unit 60 is also installed to be disposed between the first and second lead frames 31' and 32'.

The support protuberance 12', serving as a portion supporting the lens 20' as described hereinafter, is formed to have a structure making a step having a certain depth downwardly from an upper surface of the side wall 15' on an inner side of the side wall 15'. The recess portion 14' forming a space having a certain size and accommodating the LED device 100 therein is formed in an inner side of the support protuberance 12'. The recess portion 14' may be formed to have a sufficient depth to prevent the wire 50' connecting the LED device 100 to the lead frames 31' and 32' from being protruded upwardly as described hereinafter. Thus, the upper surface of the support protuberance 12' having the recess portion 14' may be positioned to be higher than the wire 50'.

The recess portion 14' may have a structure in which inner lateral surfaces are sloped to reflect light output from the LED device 100 toward the lens 20' positioned upwardly thereof to thus minimize light loss. A reflective layer (not shown) having excellent light reflectivity may be formed on the inner lateral surfaces.

Thereafter, the LED device 100 is mounted on the heat dissipation unit 60 exposed to the chip mounting region 16', and the LED device 100 is electrically connected to the first and second lead frames 31' and 32' through the wire 50'. In this case, the wire 50' is not protruded from an upper side of the support protuberance 12' from the recess portion 14'. A single LED device 100 or a plurality thereof may be mounted.

Figure 12:
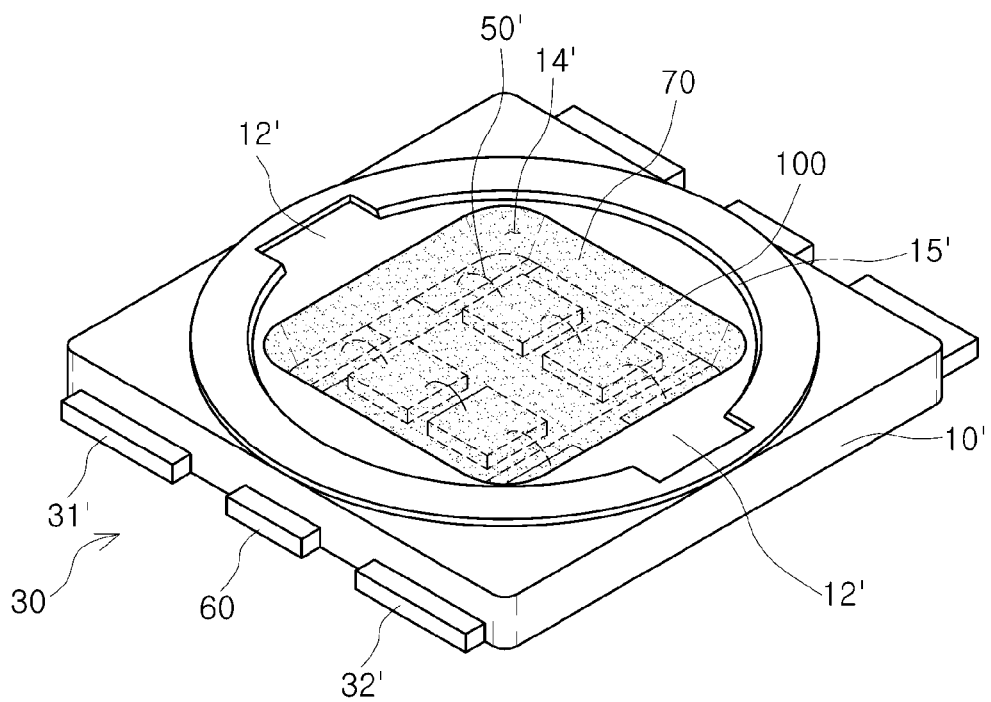

Then, as shown in FIG. 12, in order to encapsulate the LED device 100 and the wire 50', a molding resin is injected into the recess portion 14' to form the encapsulation unit 70. As the molding resin, a transparent epoxy resin, a silicon resin, or the like, may be used, and the molding resin may contain a phosphor. The encapsulation unit 70 formed within the recess portion 14' may have an upper surface parallel to that of the support protuberance 12'.

Figure 13:
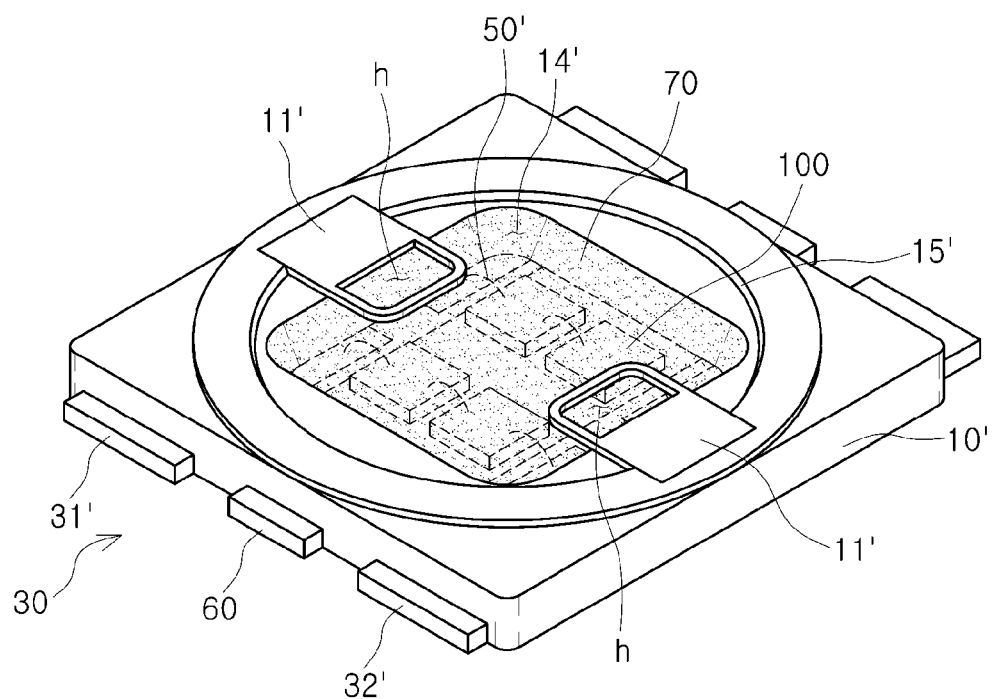

Thereafter, as shown in FIG. 13, the lens support units 11' are mounted on the package main body 10'. Portions of the lens support units 11' are placed on the support protuberance 12' so as to supported thereby, and the other remaining portions are placed over the recess portion 14' and mounted above the chip mounted region 16'.

In detail, the lens support units 11' are mounted on the support protuberance 12' and the encapsulation unit 70 filling the recess portion 14' and fixed. Since the lens support units 11' are mounted and supported by the support protuberance 12', the lens support units 11' are disposed to be higher than the wire 50'.

Figure 14:
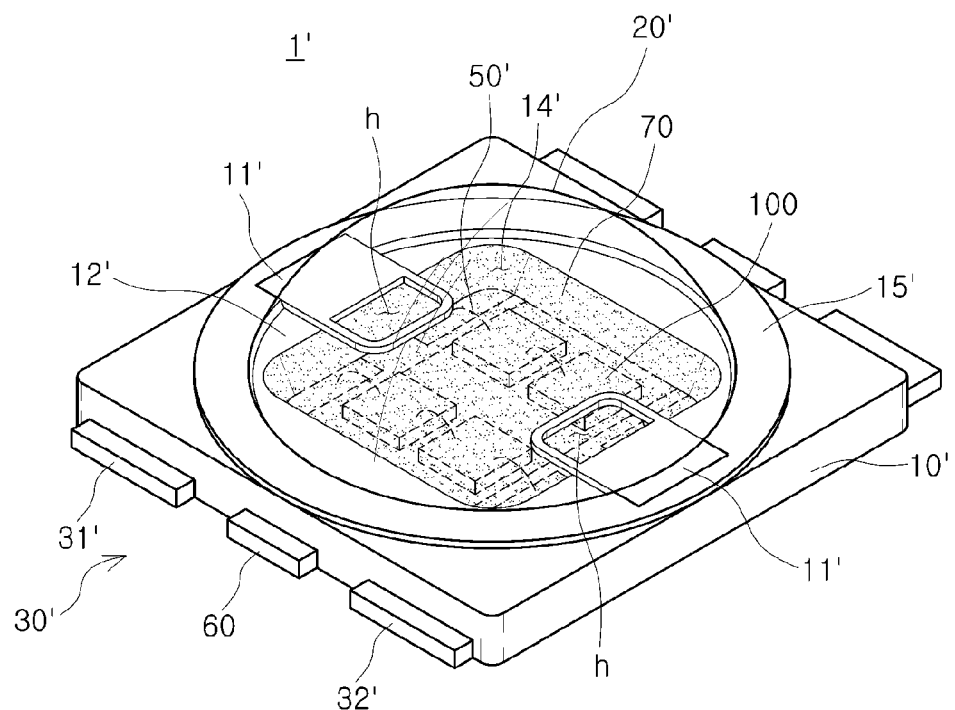

Thereafter, as shown in FIG. 14, the lens 20' is installed on the support protuberance 12' and the lens support units 11' by using a pick-up device (not shown). The lens 20' may be mounted on the support protuberance 12' formed at the inner side of the side wall 15' and on an upper surface of the encapsulation unit 70 filling the recess portion 14' and fixed through an adhesive, or the like. However, the method for bonding the lens 20' to the package main body 10' is not limited thereto and the lens 20' may be directly formed on the package main body 10' through injection molding using a mold (not shown).

Hereinafter, LED devices according to various embodiments that may be employed in a light emitting device package according to the present invention will be described with reference to FIGS. 15 through 31.

Figure 15:
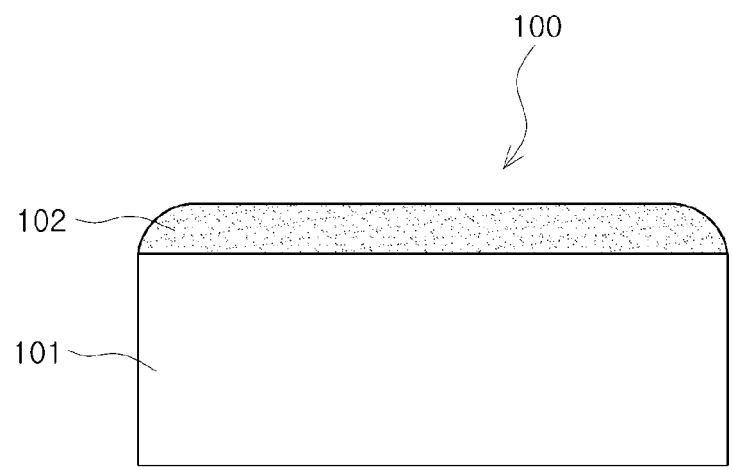
FIG. 15 is a cross-sectional view schematically illustrating a light emitting diode (LED) according to an embodiment of the present invention.

FIG. 15 is a cross-sectional view schematically illustrating a light emitting diode (LED) element according to an embodiment of the present invention. With reference to FIG. 15, the LED device 100 according to the present embodiment may include an LED chip 101 and a wavelength conversion unit 102 formed on an upper surface of the device. Here, the upper surface of the device refers to a surface formed by the LED chip 101 when the LED chip 101 is viewed from above. Specifically, the upper surface of the device may be defined as a surface formed by the LED chip 101 when a light emitting structure (i.e., a structure including first and second conductivity type semiconductor layers and an active layer, e.g., 'S' in FIG. 16) provided in the LED chip 101 is viewed from above, and this will be described in detail in an embodiment as described hereinafter. In the aspect that upper surface of the device is formed when viewed from above, the upper surface of the device may be a surface formed by regions which have different heights or are made of different materials. For example, in the case illustrated in FIG. 16, one upper surface of the device may be formed by the light emitting structure S, a p-type contact layer 208, a p-type electrode 20, and the like. Here, terms such as 'upper surface', a 'lower surface', 'lateral surface', and the like, are determined based on the drawings and may be varied according to directions in which the device is disposed in actuality.

The wavelength conversion unit 102 serves to convert a wavelength of light emitted from the LED chip 101, and to this end, a structure in which phosphors are dispersed in a transparent resin may be used. Light converted by the wavelength conversion unit 102 and light emitted from the LED chip 101 may be mixed to allow for the emission of white light from the LED device 100. For example, when blue light is emitted from the LED chip 101, yellow phosphors may be used, and when ultraviolet light is emitted from the LED chip 101, mixed red, green, and blue phosphors may be used. Besides, the colors of the phosphors and the LED chip 101 may be variably combined to emit white light. Also, only wavelength conversion materials such as green, red, and other, may be applied to implement a light source for emitting relevant colors, not necessarily white light.

In detail, when blue light is emitted from the

LED chip 101, the red phosphor used therewith may include a MAlSiNx:Re (1≤x≤5) nitride phosphor, an MD:Re sulfide phosphor, and the like. Here, M is at least one selected from among Ba, Sr, Ca, and Mg, and D is at least one selected from among S, Se, and Te, while Re is at least one selected from among Eu, Y, La, Ce, Nd, Pm, Sm, Gd, Tb, Dy, Ho, Er, Tm, Yb, Lu, F, Cl, Br, and I. Also, the green phosphor used therewith may include an $M_2SiO_4$:Re silicate phosphor, an $MA_2D_4$:Re sulfide phosphor, a β-SiAlON:Re phosphor, and an $MA'_2O_4$:Re' oxide-based phosphor of, and the like. Here, M may be at least one selected from among Ba, Sr, Ca, and Mg, A may be at least one selected from among Ga, Al, and In, D may be at least one selected from among S, Se, and Te, A' may be at least one selected from among Sc, Y, Gd, La, Lu, Al, and In, Re may be at least one selected from among Eu, Y, La, Ce, Nd, Pm, Sm, Gd, Tb, Dy, Ho, Er, Tm, Yb, Lu, F, Cl, Br, and I, and Re' may be at least one selected from among Ce, Nd, Pm, Sm, Tb, Dy, Ho, Er, Tm, Yb, F, Cl, Br, and I.

The wavelength conversion layer 102 may include quantum dots in the place of the phosphors or provided with the phosphors. A quantum dot is a nano-crystal particle including a core and a shell, and the core size thereof ranges from 2 nm to 100 nm. The quantum dot may be used as phosphor emitting various colors such as blue (B), yellow (Y), green (G), and red (R), and at least two types of a semiconductor among a group II-VI compound semiconductor (ZnS, ZnSe, ZnTe, CdS, CdSe, CdTe, HgS, HgSe, HgTe, MgTe, etc.), a group III-V compound semiconductor (GaN, GaP, GaAs, GaSb, InN, InP, InAs, InSb, AlAs, AlP, AlSb, AlS, etc.), or a group IV semiconductor (Ge, Si, Pb, etc.) may be hetero-junctioned to form a core and shell structure constituting a quantum dot. In this case, in order to terminate molecular binding on a surface of the shell of the quantum dot at an outer edge of the shell, restrain the cohesion of the quantum dot and improve the dispersion characteristics of a resin such as silicon resin, epoxy resin, or the like, or improve the phosphor function, an organic ligand, using a material such as oleic acid, may be formed. The quantum dot is vulnerable to moisture or air, and in particular, when it is in contact with a plated pattern of the substrate, or the lead frame of the package, a chemical reaction may take place. Thus, the wavelength conversion layer 140 may only be applied to the upper surface of the LED chip 120, eliminating the possibility of contact with the plated pattern or the lead frame, to thus improve the reliability thereof. Thus, although the phosphors are taken as an example of the wavelength conversion material, the phosphors can be replaced with quantum dots or quantum dots may be added to the phosphors.

In the present embodiment, the wavelength conversion unit 102 is coated in the form of a thin film on an upper surface of the device of the LED chip 101, and in comparison to the related art method in which phosphors, or the like, are injected in to the cup of the package main body, the wavelength conversion unit 120 can obtain overall uniform light. Also, the wavelength conversion unit 102 is applied directly to the surface of the LED chip 101, and when the package main body is not provided, the size of the device can be reduced. When the LED chip 101 is viewed from above, the wavelength conversion unit 102 is formed within a range not exceeding the upper surface of the device, and as illustrated in FIG. 3, a region adjacent to the corner of the upper surface of the device is formed to be curved. In this case, the other region, excluding the region formed as a curved surface, namely, the region adjacent to the center on the upper surface of the device has a flat surface substantially parallel to the upper surface of the device. Thus, the conversion wavelength unit 102 has a structure in which the flat surface is connected to the corner of the upper surface of the device by the curved surface. Here, the flat surface may have a concept including even the presence of a deviation in height which unavoidably occurs in terms of process, rather than simply referring to a state in which the overall height of the upper surface is physically uniform. For example, the height of the flat surface may vary within a range of about −10% to +10% based on an average value. Also, the region adjacent to the center in which the flat surface is formed may be defined to be a region equivalent to about 70% starting from the center on the upper surface of the device toward the corner. In this case, the wavelength conversion unit 120 may be formed to have a thickness ranging from about 25 μm to 150 μm by using a continuous dispensing process (to be described later).

In the present embodiment, since the wavelength conversion unit 102 is limitedly formed on only the upper surface of the device, the substantial area of a light source is almost equal to the area of upper surface of the device, and thus, the quantity of light per area of the light source is increased. Thus, having the increased quantity of light per area of the light source, the LED device 100 provided in the present embodiment may be appropriately used in an illumination system, e.g., a camera flash, a vehicle head lamp, a film projector light source, or the like, requiring a light source having a low étendue. Meanwhile, as described above, the wavelength conversion unit 102 has a structure in which a resin and phosphors are mixed, and in particular, the phosphors are contained in the ratio of two or more times the resin based on a weight ratio. This corresponds to a ratio in which the amount of phosphors is significantly greater in comparison to the general mixing ratio (i.e., 10:1 to 1:1) of the resin and phosphors in the related art reflective cup structure. Such a shape of the wavelength conversion unit 102 and the mixing ratio of the resin and the phosphors are considered to be a unique structure obtained through a wavelength conversion film formation process (to be described later). In addition, the wavelength conversion unit 102 may further include transparent fine particles. The transparent fine particles are mixed with the phosphors and the resin, and may include materials such as $SiO_2$, $TiO_2$, $Al_2O_3$, and the like. By appropriately adjusting the ratio of the transparent fine particles to the phosphors provided in the wavelength conversion unit 102, a color temperature of light discharged to the outside can be set to have a desired level, and for example, the phosphors may be mixed to be present in an amount double (twice) or more the amount of transparent fine particles, based on the weight ratio.

Figure 16:
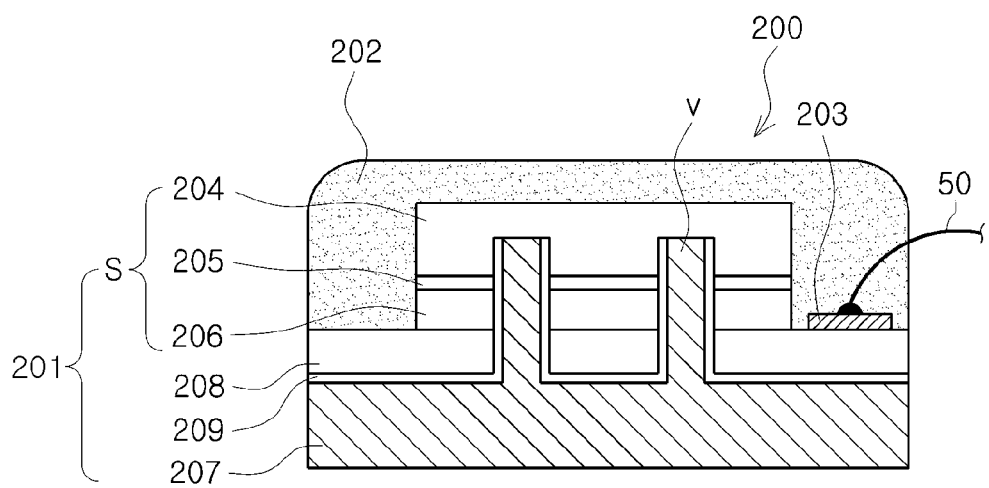
FIG. 16 is a cross-sectional view schematically illustrating an example of an LED chip that can be employed in the LED device of FIG. 15.

Meanwhile, the LED chip 101 is a type of a semiconductor light emitting device which emits light according to external power applied thereto, and may have various structures as necessary. A structure of one example will be described with reference to FIG. 16. FIG. 16 is a cross-sectional view schematically illustrating an example of an LED chip that can be employed in the LED device of FIG. 15. In detail, the LED chip illustrated in FIG. 16 has a structure in which a bonding pad is formed on a portion of an upper surface of a device.

With reference to FIG. 16, an LED device 200 includes an LED chip 201 and a wavelength conversion unit 202 formed on a light emitting surface of the LED chip 201. Similar to that of the former embodiment, the wavelength conversion unit 202 is formed to cover the upper surface of the device such that a central region of the wavelength conversion unit 202 on the upper surface has a flat surface and a corner region thereof has a curved surface. The LED chip 201 includes the light emitting structure (S) including an n-type semiconductor layer 204, an active layer 205, and a p-type semiconductor layer 206, and besides the light emitting structure (S), the LED chip 201 further includes a p-type contact layer 208 connected to the p-type semiconductor layer 206. Also, a p-type electrode 203 is formed to be connected to the p-type contact layer 208. In this case, the wavelength conversion unit 202 may be formed to cover the lateral surfaces of the light emitting structure (S) but may not cover the substrate 207 or the p-type contact layer 208. Even in this case, as shown in FIG. 4, the wavelength conversion unit 202 may satisfy the conditions in which the wavelength conversion unit 202 is formed to be limited to the upper surface of the device and has a flat surface and a curved surface.

The substrate 207 is connected to the n-type semiconductor layer 204 through a conductive via (v) and may be electrically separated from the active layer 205, the p-type semiconductor layer 206, and the p-type contact layer 208 by an insulator 209. In the present embodiment, the n-type semiconductor layer 204 may receive an electrical signal by the substrate 207, and to this end, the substrate 207 is made of an electrically conductive material. With such a structure, an electrode is not formed on an upper surface of the n-type semiconductor layer 204 provided as a light emitting surface, achieving excellent luminous efficiency, and since the plurality of conductive vias (v) and the n-type semiconductor layer 204 are in contact, a current dispersion effect can be enhanced. Meanwhile, a conductive wire 50 may be formed to be connected to the p-type electrode 203. In FIG. 16, a step between the upper surface of the n-type semiconductor layer 204 and the exposed surface of the p-type contact layer 208 is exaggeratedly depicted, and in actuality, the step may be very small in comparison to the thickness of the conductive substrate 207.

Figure 17:
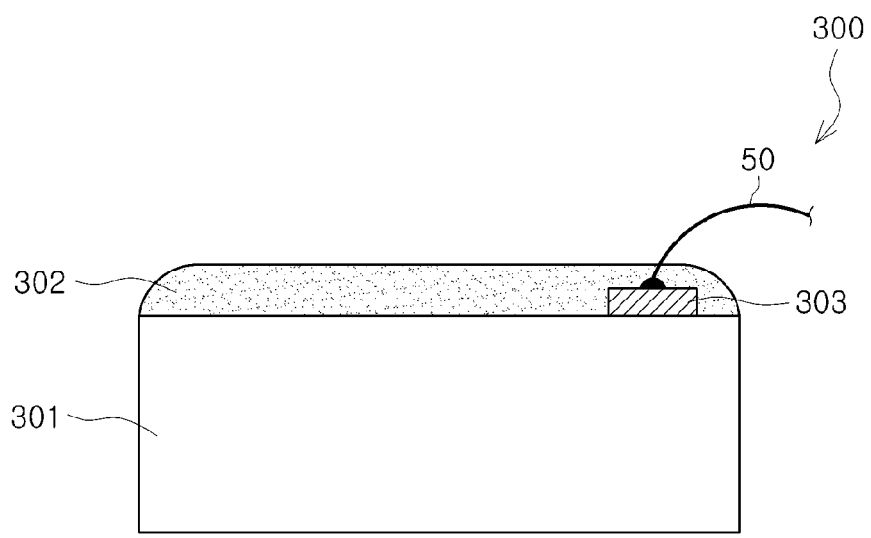
FIG. 17 is a cross-sectional view schematically illustrating an LED device according to another embodiment of the present invention.

FIG. 17 is a cross-sectional view schematically illustrating an LED device according to another embodiment of the present invention. With reference to FIG. 17, an LED device 300 according to the present embodiment includes an LED chip 301 and a bonding pad 303 formed on one surface of the LED chip 301. A wavelength conversion unit 302 is formed on the surface of the LED chip on which the bonding pad 303 is formed. The bonding pad 303 is connected to a conductive wire 50, and the wavelength conversion unit 302 is formed to cover at least the surface of the LED chip 301 and the bonding pad 303. Namely, similar to that of the former embodiment, the wavelength conversion unit 302 is formed to cover the upper surface of the device of the LED chip 301. The wavelength conversion unit 302 is formed to cover even at least one portion of a bonding region of the conductive wire 50 connected to the bonding pad 303, as well as covering the bonding pad 303. Here, the bonding region refers to a region in which the conductive wire 50 is directly in contact with the bonding pad 303, and has a width greater than the diameter of the other remaining portion of the conductive wire 50.

In this case, in FIG. 17, it is illustrated that the wavelength conversion unit 302 covers the entirety of the bonding region of the conductive wire 50, but, if the wavelength conversion unit 302 is provided in a state of covering the bonding pad 303, it may be also possible that the wavelength conversion unit 302 is in contact with only an extremely partial portion of the conductive wire 50. The structure in which the wavelength conversion unit 302, covering the bonding pad 303, is in contact with the conductive wire 50, may be obtained by coating (or forming) a wavelength conversion film after the conductive wire 50 is formed, and this will be described later. Besides such a difference, the wavelength conversion unit 302 may have the same shape, the same constituent material, and the like, as those of the wavelength conversion unit of the former embodiment.

Figure 18:
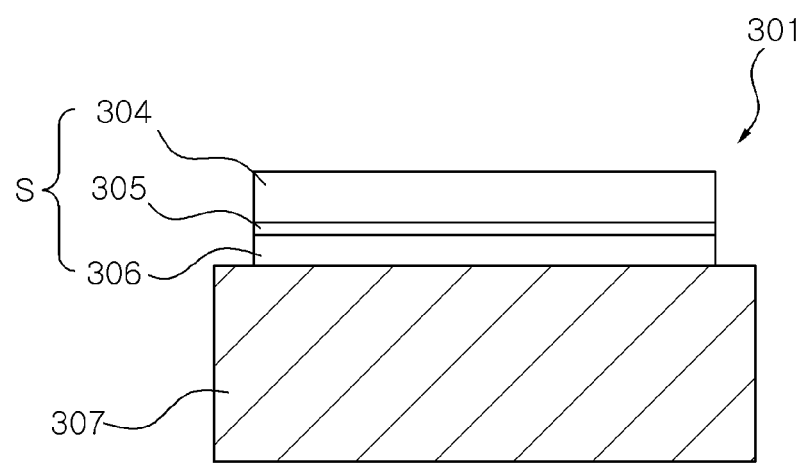
FIG. 18 is a cross-sectional view schematically illustrating an example of an LED chip that can be employed in the LED device of FIG. 17.
Figure 19:
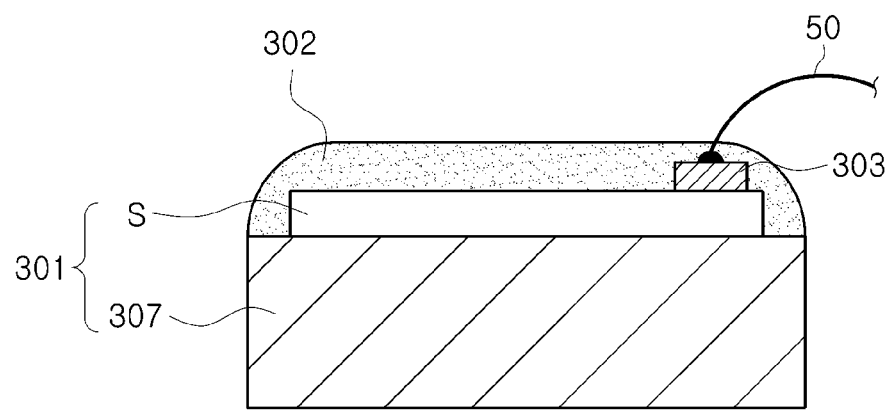
FIG. 19 is a cross-sectional view illustrating the LED device employing the LED chip of FIG. 18.

In the present embodiment, the LED chip 301 having the structure in which the bonding pad 303 is formed on one surface thereof and the wavelength conversion unit 302 covers the bonding pad 303 may be variably applicable. FIG. 18 is a cross-sectional view schematically illustrating an example of an LED chip that can be employed in the LED device of FIG. 17. Also, FIG. 19 is a cross-sectional view illustrating the LED device employing the LED chip of FIG. 18. With reference to FIGS. 18 and 19, the LED chip 301 has a structure in which a light emitting structure (S) is disposed on the conductive substrate 307, and in the light emitting structure (S), a p-type semiconductor layer 306, an active layer 305, and an n-type semiconductor layer 304 may be sequentially disposed. The conductive substrate 307 serves as a p-type electrode, as well as serving to support the light emitting structure (S), and may be made of a material including any one of Au, Ni, Al, Cu, W, Si, Se, and GaAs. For example, the conductive substrate 307 may be made of a material obtained by doping aluminum (Al) in silicon (Si), or the like. In the present embodiment, an upper surface of the device may be formed to include an upper surface of the light emitting structure (s) and a portion of the upper surface of the substrate 307, namely, a region not occupied by the light emitting structure (S).

The wavelength conversion unit 302 is formed to cover the upper surface of the device, and like that of the former embodiment, the wavelength conversion unit 302 has a flat surface at a central region thereof on the upper surface of the device and a curved surface at the corner region. Also, the light emitting structure (S) may be formed to occupy only a portion of the upper surface of the conductive substrate 307. In detail, the light emitting structure (S) may be formed on a region excluding at least one portion of the edge regions. This may be achieved through an etching process for separating the light emitting structure (S) in units of devices. In this case, in the aspect that light is emitted even from the lateral surface of the light emitting structure (S), the wavelength conversion unit 302 may formed to cover even the lateral surface of the light emitting structure (S). Meanwhile, the LED chip 301 described above with reference to FIG. 17 has a vertical structure, and the wavelength conversion unit 302 may be applied even to a horizontal structure in a similar manner.

Figure 21:
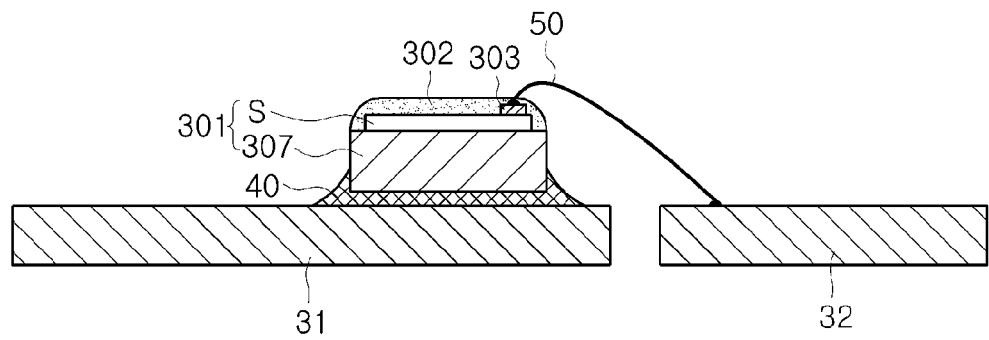
FIG. 21 is a cross-sectional view schematically showing a structure in which the LED device of FIG. 19 mounted on a lead frame.

As illustrated in FIG. 21, the LED device 300 is mounted on one of the lead frames 31 and 32, e.g., on the first lead frame 31, and the conductive substrate 307 may be physically joined and electrically connected to the first lead frame 31 by the medium of a conductive adhesive layer 40. The conductive wire 50, connected to the bonding pad 303 and has a portion, e.g., a bonding region, buried in the wavelength conversion unit 302, may be connected to the second lead frame 32.

Figure 20:
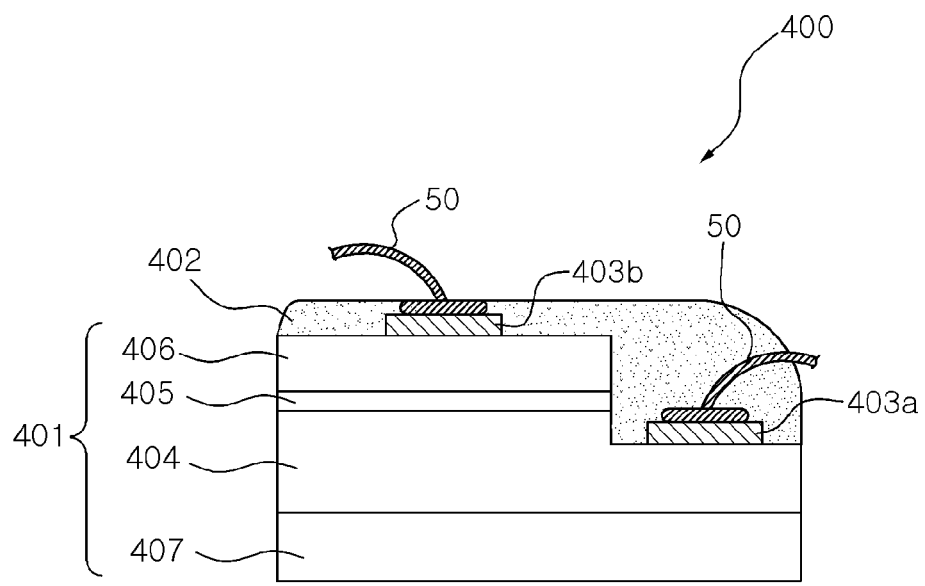
FIG. 20 is a cross-sectional view schematically illustrating an LED device according to another embodiment of the present invention.

FIG. 20 is a cross-sectional view schematically illustrating an LED device according to another embodiment of the present invention. With reference to FIG. 20, an LED device 400 according to the present embodiment includes a substrate 407, an n-type semiconductor layer 404, an active layer 405, and a p-type semiconductor layer 406. An n-type electrode 403a and a p-type electrode 403b are formed on an exposed surface of the n-type semiconductor layer 404 and on one surface of the p-type semiconductor layer 406, respectively. The LED chip 401 has a horizontal structure. A wavelength conversion unit 402 is formed on the surface of the n-type and p-type semiconductor layers 404 and 406. Thus, the wavelength conversion unit 402 covers the n-type and p-type electrodes 403a and 403b corresponding to bond pads, and formed to be in contact with a portion of the conductive wire 50. The LED device 400 is disposed on the substrate 407, and external power may be applied thereto through the conductive wire 50. In the present embodiment, when viewed from above, the upper surface of the n-type semiconductor layer 40 and that of the p-type semiconductor layer 406 constitute an upper surface of the device, and the wavelength conversion unit 402 may be formed on the upper surface of the device. In this case, in FIG. 20, a step between the upper surface of the n-type semiconductor layer 404 and that of the p-type semiconductor layer 406 is exaggeratedly depicted, and in actuality, the step may be very small in comparison to the thickness of the substrate 407.

Figure 22:
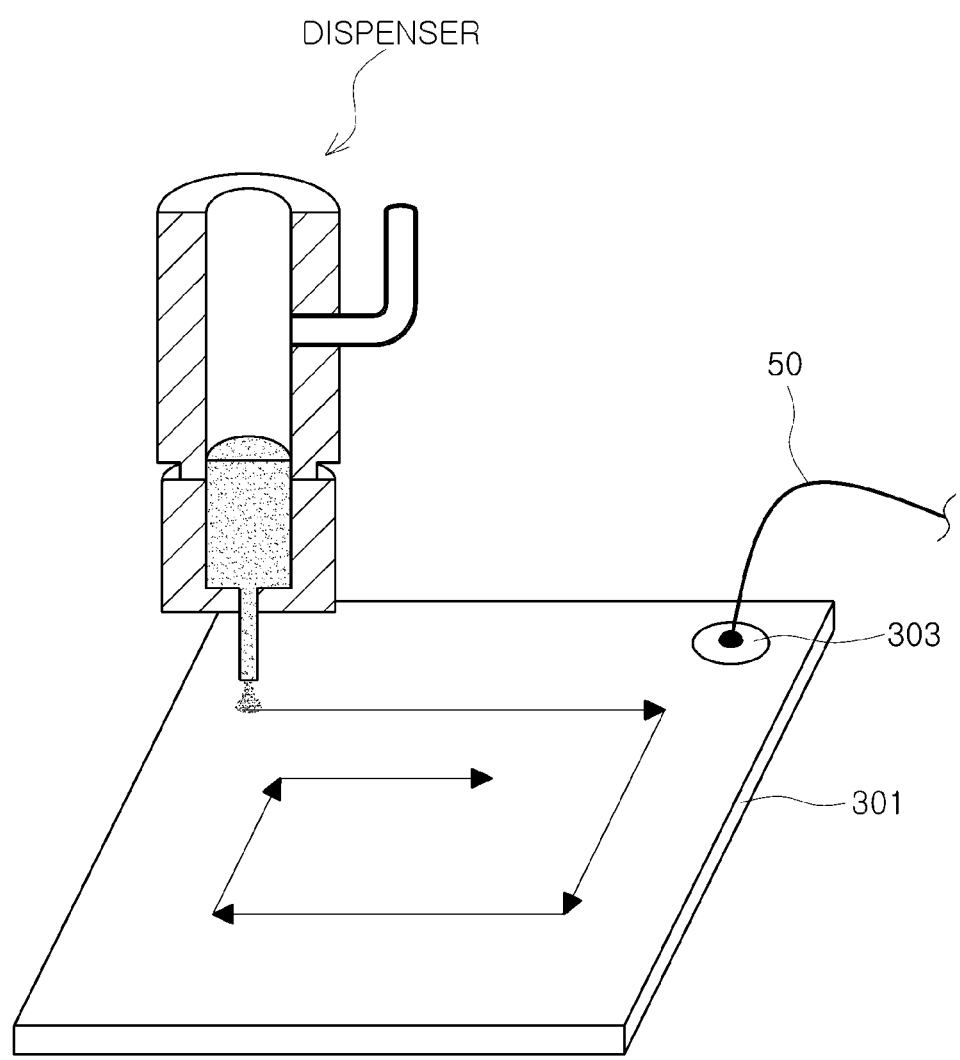
FIGS. 22 and 23 are perspective views for explaining a method of forming a wavelength conversion film that may be employed in an embodiment of present invention.
Figure 23:
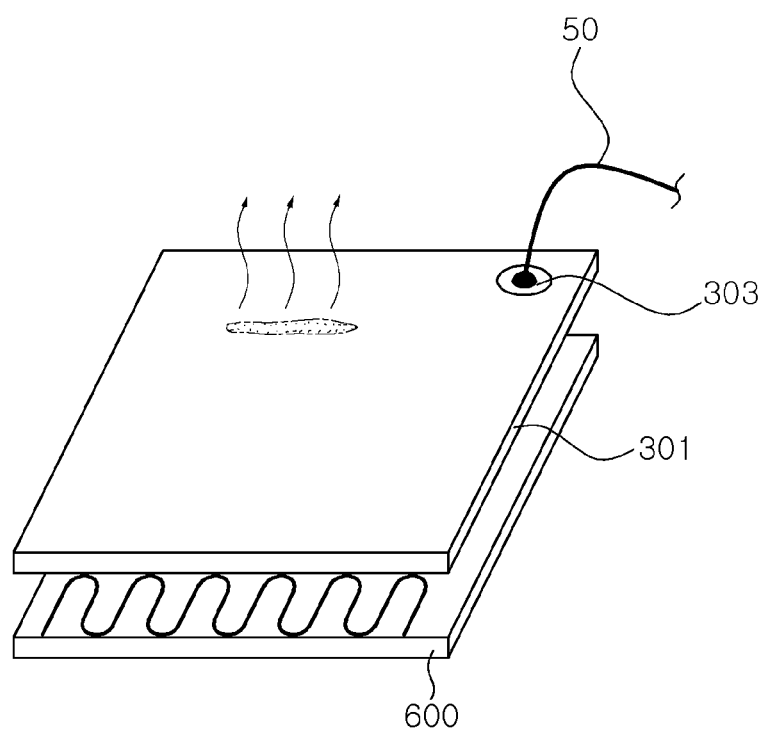

FIGS. 22 and 23 are perspective views for explaining a method of forming a wavelength conversion film that may be employed in an embodiment of present invention. Specifically, FIG. 22 illustrates a process of applying a phosphor mixture by using a dispenser, and FIG. 23 illustrates a state in which a solvent is evaporated after a certain amount of phosphor mixture is applied. FIGS. 22 and 23 illustrate a process of coating a wavelength conversion film on the structure in which the bonding pad 303 has been formed on one surface thereof, namely, a light emitting surface (which corresponds to the upper surface of the device in the former embodiment) of the LED chip 301, but such a phosphor applying process may also be applied to a light emitting surface without a bonding pad as shown in FIG. 15.

First, as shown in FIG. 22, the LED chip 301, a type of a light emitting device, is prepared and a phosphor mixture is applied to a light emitting surface of the LED chip 301. In this case, the LED chip 301 may have such a structure as described above with reference to FIG. 17. Before applying the phosphor mixture, the LED chip 301 may have been separated in device units, and thereafter, in order to be used as a light source of a light emitting device, the LED chip 301 may be die-bonded to a conductive structure such as a lead frame. In the case of the wavelength conversion film forming process proposed in the present embodiment, the bonding pad 303 is formed on the light emitting surface before the dispensing process, and the conductive wire 50 is formed to be connected to the bonding pad 303. In this case, the conductive wire 50 may be connected to a different power source terminal, e.g., a lead frame. Then, in a state in which the conductive wire is connected to the LED chip 301, a dispenser for applying (or dispensing) the phosphor mixture is positioned above the LED chip 301.

The phosphor mixture further includes a solvent in addition to a resin and phosphors. In general, as a method for forming the wavelength conversion film, a process of applying the mixture of the resin and the phosphors and then curing (or hardening) the resin may be performed. When this method is used, the wavelength conversion film is formed to have a curved surface overall due to surface tension of the resin before the resin is cured, having difficulty in forming the wavelength conversion firm having a uniform thickness. In the present embodiment, the amount of the phosphors is relatively increased over the resin before being cured, thereby reducing viscosity of the mixture applied to the LED chip 301. In detail, a mixture in which the phosphors are mixed in an amount double or more to that of the resin, based on the weight ratio, is preferably used, and a required level of viscosity can be guaranteed under the mixing ratio condition. In addition, as described above, the mixture may further include fine particles made of a material such as $SiO_2$, $TiO_2$, $Al_2O_3$, or the like, in order to adjust color temperature, and in a case of a mixing ratio, preferably, the phosphors are provided in an amount double (twice) or more that of the transparent fine particles based on a weight ratio.

Here, however, an increase in the viscosity according to an increase in the amount of the phosphors may cause difficulty in the dispensing process and a problem in which the mixture is spread on the surface of the light emitting surface to make it difficult to form a film. Thus, in order to solve this problem, a certain amount of solvent may be added to the phosphor mixture. The solvent is mixed together with a resin and phosphors or a resin, phosphors, and transparent fine particles, and provides viscosity to the phosphor mixture to allow the dispensing process to be smoothly performed. Also, the phosphor mixture having viscosity by the solvent may be easily spread from the position at which it was applied from the dispenser, and thus, a wavelength conversion unit having a desired thin film structure can be easily formed. In this manner, the solvent only performs the function of adding viscosity, so a large amount of the solvent is not required and the solvent may be mixed with the phosphors in an amount equal to of about one-tenth of that of the phosphors, based on weight.

As described above, the phosphor mixture is applied to the surface of the LED chip 301 by the dispenser, and in this case, as shown in FIG. 22, the phosphor mixture may be applied by moving the dispenser, for example, in a spiral or zigzag manner so that the phosphor mixture can be uniformly applied to the surface of the LED chip 301. In this case, dispensing is performed until the bonding pad 303, as well as the surface of the LED chip 301, is covered, and through this process, even a portion of the conductive wire 50 may be covered by the wavelength conversion film (or the wavelength conversion unit). Meanwhile, in the present embodiment, dispensing refers to continuously applying the phosphor mixture through a needle by applying pressure by a pump (namely, in most cases, a state in which the phosphor mixture is continued supplied from the dispenser to the upper surface of the chip is maintained), different from a process such as spray coating in which a mixture is granulated and aerosolized, or the like.

A process of forming a wavelength conversion film after the dispensing operation will be described with reference to FIG. 23. The solvent of the phosphor mixture in the state of having been applied from the dispenser is evaporated, reducing viscosity of the phosphor mixture, and according to the reduction in the viscosity, the resin and phosphor is fixed to the surface of the LED chip 301, thus completing the wavelength conversion unit in the form of a thin film. In order to allow the solvent to be evaporated during the dispensing process, a material having volatility, e.g., an organic solvent material such as a polymer, a monomer, ethanol, methanol, acetone, or the like, having a relatively low molecular mass, may be used as a solvent.

Meanwhile, if the evaporation of the solvent is delayed during the dispensing process, there is a possibility in which a wavelength conversion unit having a desired shape cannot be obtained due to excessive viscosity. Thus, in order to accelerate evaporation of the solvent, a heating unit 600 may be operated to apply heat to the phosphor mixture during the dispensing process. By employing the heating unit 600, viscosity of the phosphor mixture can be reduced immediately after the phosphor mixture is applied to the surface of the LED chip 301, deformation of the phosphor mixture can be further reduced and a wavelength conversion film having a flat shape can be formed. In this case, preferably, the LED chip 301 is heated at a temperature of about 50° C. to 170° C., appropriate for reducing viscosity. However, when the method according to this embodiment is employed, it is difficult to obtain a flat surface even at a region corresponding to the corner of the LED chip 301, and the thickness of the wavelength conversion film is gradually reduced at the corner region to form a curved surface, thus obtaining the LED device having the foregoing structure.

In this manner, when the method for forming the wavelength conversion film proposed in the present embodiment is used, phosphor content is increased and the solvent having volatility is used to supplement viscosity, thereby only forming the wavelength conversion film on the desired particular surface of the LED chip, and here, the wavelength conversion film can be obtained to have a desired thickness and shape by minimizing deformation of the phosphor mixture during the dispensing process. Also, since viscosity of the phosphor mixtures is low, deformation of the shape of the wavelength conversion film due to surface tension can be minimized. In addition, after the LED chip is separated in units of devices, the wavelength conversion film is individually applied. Thus, in this sense, the thickness or the content of the wavelength conversion film can be adjusted appropriately in a state in which the characteristic of devices are recognized in advance. In an LED chip or a light emitting device using the wavelength conversion film obtained thusly, the thickness of the wavelength conversion film can be precisely controlled, having an advantage in that color temperature deviations between products are small. Namely, in a wafer level wavelength conversion film conversion method, specifically, in case of collectively forming the wavelength conversion film before the separation by devices, since the wavelength conversion film having the identical thickness is indiscriminately applied without considering or reflecting luminous characteristics of the respective devices, the deviation of color temperature may be increased in comparison to the present invention.

An LED device according to another embodiment of the present invention will be described with reference to FIGS. 24 through 26. FIGS. 24A and 24B and FIGS. 25A and 25B illustrate a method of fabricating an LED device according to another embodiment of the present invention.

The fabrication method as described hereinafter may be performed on a bulk substrate on which a plurality of LED chips are arrayed, but only a single chip is illustrated in FIGS. 24A and 24B and FIGS. 25A and 25B, for the sake of explanation.

Figure 24A:
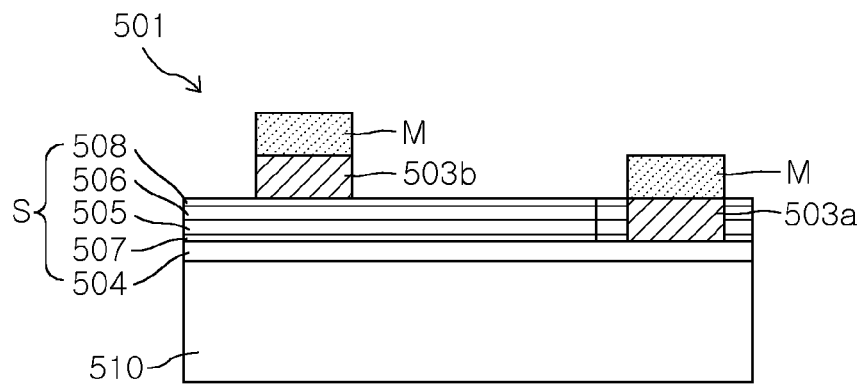
FIGS. 24 and 25 are views schematically illustrating sequential processes of a method of fabricating an LED device according to another embodiment of the present invention.
Figure 24B:
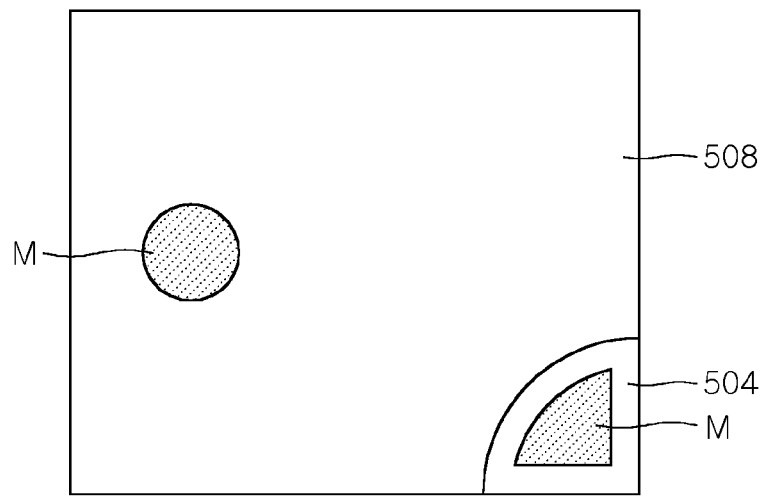

First, with reference to FIGS. 24A and 24B, an LED chip 501 structure, namely, a light emitting structure (S), is positioned on a substrate 510. The substrate 510 may be a silicon substrate or may be made of aluminum oxide ($Al_2O_3$). An n-type semiconductor layer 504 is formed on the substrate 510, and an active layer 505 and a p-type semiconductor layer 506 are sequentially formed thereon. Here, the lamination order of the n-type and p-type semiconductor layers 504 and 506 may be interchangeable, but the active layer 505 should be necessarily positioned between the n-type and p-type semiconductor layers 504 and 506. A transparent electrode layer 508 may be formed on a surface of the p-type semiconductor layer 506. An n-type or p-type multilayered film 507 may be positioned below or above the active layer 505 and may have various structures such as an irregular structure (a depression or protrusion structure), a scattering layer having a particle shape, and the like, in order to enhance luminance efficiency. The light emitting structure (S) is a structure emitting ultraviolet light or blue light.

The embodiment of the present invention is not only limitedly applied to the LED chip 501 having the structure illustrated in the accompanying drawing. The illustrated LED chip 501 is merely an example. Namely, the LED chip 501, applicable to the present invention, may be sufficient when it includes the light emitting structure (S) having a certain structure and bonding pads 503a and 503b for connecting the light emitting structure (S) to the outside.

In order to fabricate an LED device which emits light having multiple wavelengths by using the LED chip 501, first, a mask pattern (M) is formed on one surface of the LED chip 501. The mask pattern (M) is used to mask certain portions, e.g., the bonding pads 503a and 503b, on which a phosphor film should not be deposited. Preferably, the mask pattern (M) may be formed by using photoresist (PR), but the mask pattern (M) may be formed as an oxide film or a nitride film. The formation of the mask pattern (M) by using photoresist is convenient because a general photolithography process used for a semiconductor fabrication process can be used.

Figure 25A:
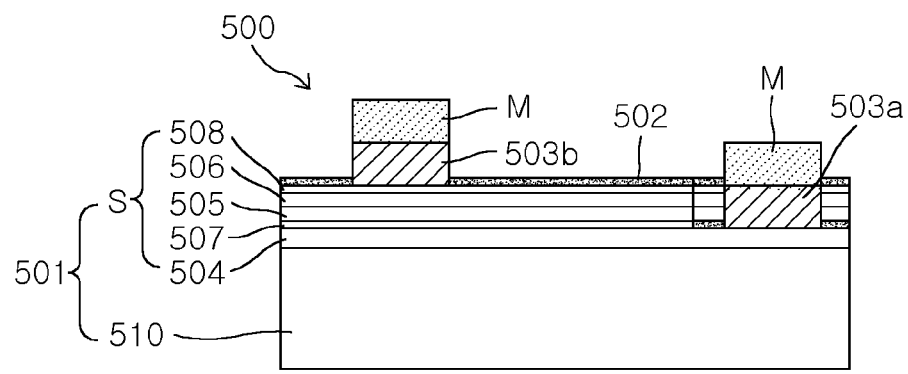
Figure 25B:
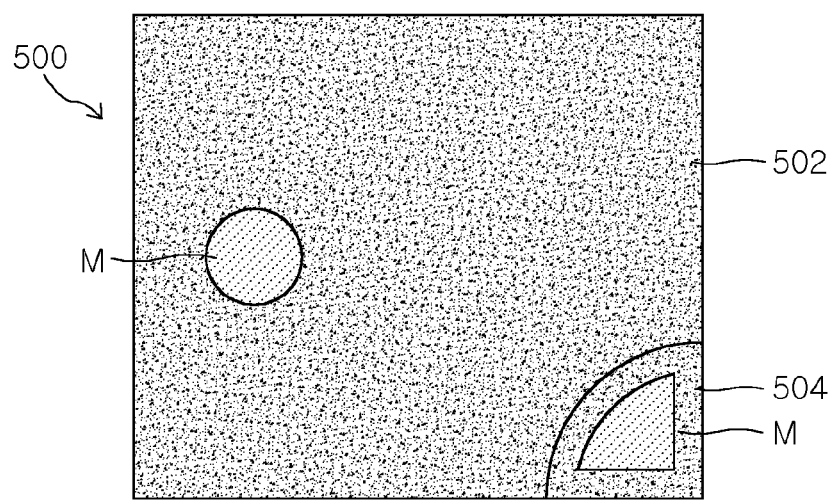

Next, with reference to FIGS. 25A and 25B, a process of forming a phosphor film 502, i.e., a wavelength conversion unit, on the LED chip 501 is performed. Namely, the phosphor film 502 is formed to have a certain thickness on the surface of the portions of the LED chip 501, excluding the bonding pads 503a and 530b masked by the mask pattern (M).

When the phosphor film 503 is formed on the surface of the LED chip 501, phosphors can be uniformly dispersed to be deposited on the surface of the LED chip 501 and the amount of the phosphors deposited can be appropriately controlled. Thus, using this process, the LED device 500 having a wavelength desired to be obtained by light emitted from the LED device 500, namely, a desired color, and uniform characteristics of emitted light, can be fabricated.

The phosphor film 502 may be formed by using a sputtering method or a pulsed laser deposition (PLD) method. Namely, in the present embodiment, the phosphor film 502 is directly formed on the surface of the LED chip 501 by applying a certain amount of physical or chemical energy to the surface of the LED chip 501, rather than attaching phosphors or a material including phosphors to the surface of the LED chip 501 by using an adhesive, or the like. Thus, a problem in which efficiency of light emitted from the LED chip 501 is degraded due to an adhesive, or the like, is eliminated. Also, the characteristics of light desired to be emitted can be adjusted by adjusting the amount or type of phosphors included in fabricating a sputtering target, the LED device 500 having excellent quality and multiple wavelengths cab be easily fabricated.

When the sputtering method is used, pulsed DC power or RF power may be used to power the process. For example, when the phosphor film 503 is formed by using the sputtering method, a target of a sputtering process can be generated by using a material obtained by mixing a phosphor in at least one of oxides including $SiO_2$, SiO, CIO, ITO, IO, $Al_2O_3$, or ZnO, nitrides including SiN, AlN, GaN, or InN, an epoxy resin, and a silicon resin. Then, the sputtering process may be performed by using the target to directly form the phosphor film 502 on the surface of the LED chip 501. The target of the sputtering process may be fabricated by sintering and forming the target material to obtain a tablet having a size, for example, of about 2 inches.

Any material such as a YAG-based material, a non-YAG-based material, or the like, may be used for phosphors included in the target. The non-YAG-based material includes a garnet-based material, a silicate-based material, or a sulfide-based material including TAG. TAG is a typical non-YAG-based material among the garnet-based materials, and Y of YAG and Tb of TAG may be substituted with Lu, Sc, La, Gd, Sm, Ca, or Si. The silicate-based material includes (Sr, Ba, Ca, Mg, Zn, Cd, Y, Sc, La)$_x$Si$_y$O$_z$:(Eu, F, Mn, Ce, Pb), and here, the components in parentheses may be variably combined or may be used alone ($0 \leq x, y, z \leq 16$). As a nitride-based or sialon-based phosphor, a phosphor material composed of $Ca_x(Si, Al)_{12}(O, N)_{16}$ may be used. Here, $Ca_x$ may be substituted with a different metal element, and one or more types of Eu, Pr, Tb, Yb, Er, and Dy are included as an activator. The sulfide-based phosphor may include at least one type of materials including (Ca, Sr)S, $SrGa_2S_4$, (Ca, Sr, Ba) (Al, Ca)$_2S_4$, (Sr, Mg, Ca, Ba) (Ga, Al, In)$S_4$, $Y_2O_2$, and Eu, Ce, or the like, may be used as an activator. The element components in parentheses of the foregoing chemical formulas may vary according to wavelength regions.

An appropriate type of phosphor may be used according to the types of the LED chip 501 in use and the wavelength of light desired to be obtained. For example, in case of using the LED chip 501 emitting ultraviolet light, phosphors may be selectively used to generate light of a color that can be obtained by using one of blue light, green light, yellow light, and red light or by combining two or more of. Also, in a case of using the LED chip 501 emitting blue light, phosphors may be selectively used to generate light of a color that can be obtained by using one of green light, yellow light, and red light or by combining two or more of them.

For example, phosphors may be selectively used to generate light of a color that can be obtained by using at least one of $BaMgAl_{10}O_{17}$:Eu, $Sr_5(PO_4)_3Cl$:Eu, and ZnS:Ag as phosphors emitting blue light, at least one of a sulfide-based material such as ZnS:Cu, (Ca, Sr)S:Eu, a silicate-based material such as (Sr, Ba, Ca, Mg, Zn, Cd, Y, Sc, La)$_x$Si$_y$O$_z$:(Eu, F, Mn, Ce, Pb), and $BaMgAl_{10}O_{17}$:Eu, Mn, as phosphors emitting green light, at least one of garnet-based material and silicate-based material including YAG-based material or TAG-based material as phosphors emitting yellow light, and at least one of nitride-based material, a sulfide-based material such as $Y_2O_2S Y_2O_2S$, and $YVO_4$:$Eu^{3+}$, Y(V, P, B)$O_4$:$Eu^{3+}$, $YNbO_4$:$Eu^{3+}$, $YTaO_4$:$Eu^{3+}$, of by combining two or more of them, respectively.

Figure 26A:
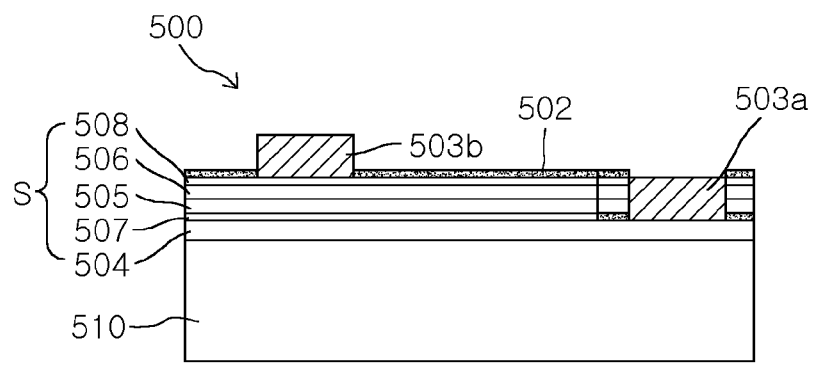
FIG. 26 is a view schematically illustrating an LED device fabricated according to the method of FIGS. 24 and 25.
Figure 26B:
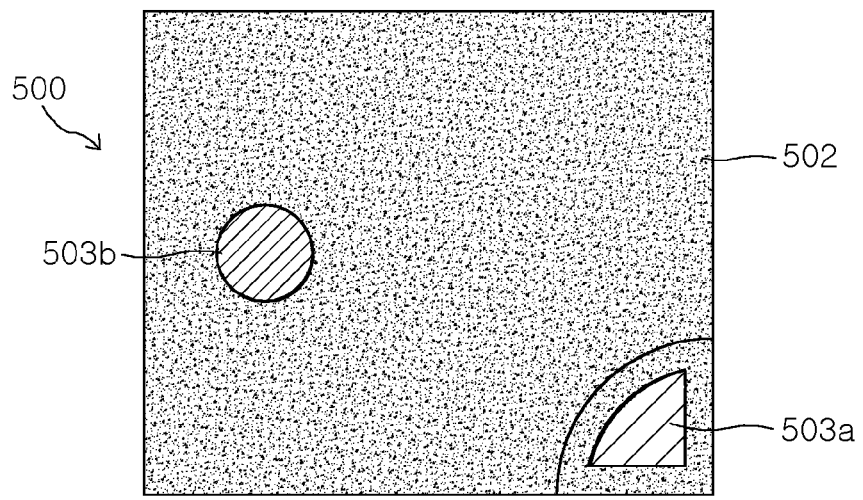

Subsequently, when the mask pattern (M), or the like, formed at the upper portions of the bonding pads 503a and 503b, or the like, is removed, the LED device 500 according to another embodiment of the present invention illustrated in FIG. 26 is formed. As illustrated, the phosphor film 503 is distributedly formed on the LED chip 501, excluding the bonding pads 503a and 503b, and such a distribution has a structure smaller than the overall thickness of the electrode layer including the bonding pads 503a and 503b.

An LED device according to another embodiment of the present invention will be described with reference to FIGS. 27 through 29.

An LED device 600 according to the present embodiment includes an LED chip 601, a bonding pad 603, a wavelength conversion unit 602, and a sub-mount 610, and the LED chip 601 is die-attached to be mounted on the sub-mount 610, which is a light source generating light when power is applied thereto.

The LED chip 601, a light source generating near-UV light or blue light when power is applied thereto, may be a GaN-based LED chip generating high output, high luminance blue light. The LED chip 601 may have a horizontal structure in which a p-type electrode and an n-type electrode are formed on an upper surface thereof, or a vertical structure in which the p-type electrode and the n-type electrode are formed on upper and lower surfaces thereof.

The bonding pad 603, electrically connected to the conductive wire 50, may be formed on the upper surface of the LED chip 601, and a single bonding pad 603 or a plurality thereof may be provided according to the horizontal or vertical structure of the LED chip 601. Namely, according to the structure of the LED chip 601, the number of formed bonding pads 603 is varied. When the LED chip 601 has a vertical structure in which the p-type electrode and the n-type electrode are formed on upper and lower surfaces thereof, a single bonding pad 603 may be provided to be electrically connected to the p-type electrode formed on the upper surface of the LED chip 601. Also, when the LED chip 601 has a horizontal structure in which both the p-type electrode and the n-type electrode are formed on the upper surface of the LED chip 601, a plurality of bonding pads 603 may be provided to be electrically connected to the p-type electrode and the n-type electrode formed on the upper surface of the LED chip 601.

The wavelength conversion unit 602 may be made of a transparent resin material such as epoxy, silicon, a resin, or the like, to uniformly cover an outer surface of the LED chip 601. The resin may include a phosphor material such as a YAG-based, TAG-based, or silicate-based phosphor material as a wavelength conversion means for converting light generated from the LED chip 601 into white light.

Figure 27A:
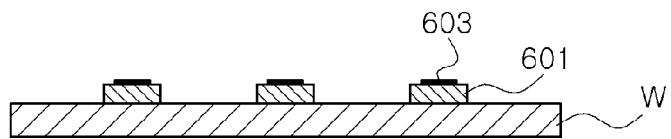
FIGS. 27A to 27F are views schematically illustrating sequential processes of fabricating an LED device according to another embodiment of the present invention.

FIGS. 27A to 27F are views schematically illustrating a process of fabricating the LED device according to the foregoing embodiment. The LED device 600 according to the present embodiment may be fabricated through operations A to F.

a. Operation of Providing a Wafer on which a Plurality of LED Chips are Die-Attached As illustrated in FIG. 27A, the plurality of LED chips 601 fabricated according to a semiconductor fabrication process are mounted to be spaced apart from each other on a wafer (W) in a die-attachment manner.

At least one bonding pad 603 is provided on the upper surface of the LED chip 601, and here, according to an electrode disposition configuration of the LED chip 601 having a vertical structure or a horizontal structure, a single bonding pad 603 or a plurality thereof may be provided. The bonding pad 603 may be made of a metal, such as Au, Al, Cu, or the like, having excellent conductivity.

Figure 27B:
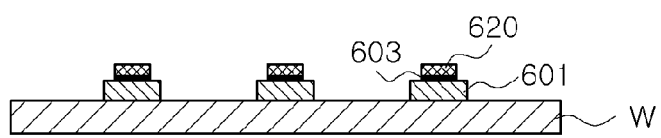
Figure 27C:
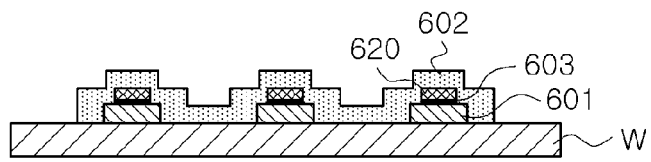

The wafer (W) may be made of one selected from among a non-conductive material and a conductive material according to a disposition configuration of a p-type electrode and an n-type electrode provided on the LED chip 601.

b. Operation of Covering at Least One Bonding Pad Formed on Upper Surface of the LED Chip with Pad Protection Unit As shown in FIG. 27B, a pad protection unit 620 may be provided to cover at least one bonding pad 603 formed on the upper surface of the LED chip 601 die-attached to the wafer (W) to protect it. The pad protection unit 620 may have the same size as that of the bonding pad 603 such that the bonding pad 603 is not exposed upwardly. The pad protection unit 620 may be made of photoresist, but the present invention is not limited thereto.

c. Operation of Forming Wavelength Conversion Unit Having Certain Thickness by Applying Resin Material to LED Chip and Wafer As shown in FIG. 27C, a transparent resin such as silicon, epoxy, or the like, is printed to have a certain thickness on the wafer (W) such that the plurality of LED chips 601 including the pad protection units 620 formed on the bonding pads 603 and the wafer (W) are covered by the resin material, through a printing method to form a wavelength conversion unit 602.

Figure 27D:
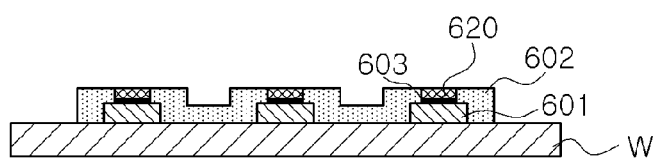

The wavelength conversion unit 602 printed on the wafer (W) to cover the entirety of the LED chips 601 including the bonding pads 603 and the pad protection units 620 is cured by artificially provided heat or UV light. Here, the resin material used for forming the wavelength conversion unit 602 may include a phosphor material as a light wavelength conversion means for converting the wavelength of a light emission color of each LED chip 601 in order to convert a light emission color of each LED 601 into white light according to the light emission color of each LED 601.

d. Operation of Removing Upper Surface of Wavelength Conversion Unit to Expose Pad Protection Unit As shown in FIG. 27D, when the wavelength conversion unit 602 provided to cover the LED chip 601 mounted on the wafer (W) is exposed to light irradiated from above, the uppermost surface of the wavelength conversion unit 602 is etched to be removed, exposing the pad protection unit 620. Here, irradiation of light to the upper surface of the wavelength conversion unit 602 should be stopped immediately when the upper surface of the pad protection unit 620 is exposed.

Also, in a different method of partially removing the wavelength conversion unit 602 to expose the pad protection unit 620, a portion of the upper surface of the wavelength conversion unit 602 may be removed by using a polishing unit. Namely, the resin material may be removed by polishing the wavelength conversion unit 602 through a polishing method using a grinder or a cutting method using a fly cutter, thus exposing the pad protection unit 620 provided on the LED chip 601.

Figure 27E:
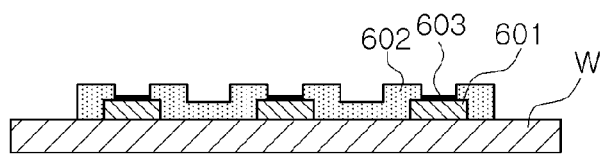

Here, after being etched to be removed by light or polished to be removed by the polishing unit, the wavelength conversion unit 602 remains to have a uniform layer thickness such that an upper surface thereof is parallel to the wafer (W).

e. Operation of Removing Pad Protection Unit Exposed From Wavelength Conversion Unit As shown in FIG. 27E, when the pad protection unit 620 exposed from the upper surface of the wavelength conversion unit 602 is removed to be separated from the bonding pad 603 and the wavelength conversion unit 602, a space tantamount to the removed pad protection unit 620 is formed at an upper portion of the LED chip 601 and, at the same time, the bonding pad 603 is exposed.

f. Operation of Dividing Wafer into a Plurality of LED Chips

Figure 27F:
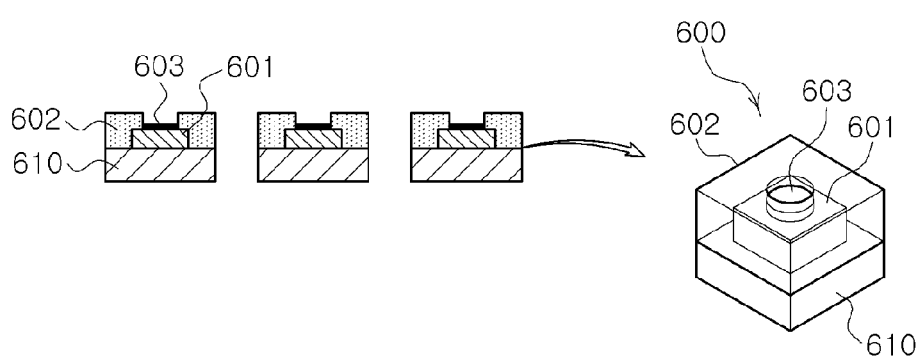

Subsequently, as shown in FIG. 27F, the LED chip 601 with the bonding pad 603 exposed to the outside is cut along vertical and horizontal cutting lines formed between an adjacent LED chip 601, thus being fabricated into an individual LED device 600.

The LED device 600 includes the LED chip 601 die-attached to the sub-mount 610 after being separated from the wafer (W), at least one bonding pad 603 provided on the upper surface of the LED chip 601, and the wavelength conversion unit 602 uniformly covering the outer surface of the LED chip 601, while exposing the bonding pad 603.

FIGS. 28A to 28F are views schematically illustrating sequential processes of fabricating an LED device according to another embodiment of the present invention. An LED device 600' according to the present embodiment may be fabricated through operations a' to f'.

a'. Operation of Providing Wafer with a Light Emitting Structure Constituting an LED Chip Including a Plurality of Bonding Pads Formed on Upper Surface Thereof As shown in FIG. 28A, a wafer (W') with a light emitting structure (S) formed thereon and constituting an LED chip 601' is provided through a semiconductor fabrication process, and a plurality of bonding pads 603' may be provided to be spaced apart from each other on an upper surface of the light emitting structure (S).

Here, the wafer (W') may be provided as a semiconductor single crystal growth substrate, and may be made of any one selected from among a non-conductive material or a conductive material according to a disposition configuration of a p-type electrode and an n-type electrode provided in the LED chip 601'.

The light emitting structure (S) includes n-type and p-type semiconductor layers 604' and 606' and an active layer 605' formed between the n-type and p-type semiconductor layers 604' and 606'. A single bonding pad 603' or a plurality thereof may be provided according to a disposition configuration of electrodes of the LED chip 601' having a horizontal structure or a vertical structure, and may be made of a conductive material such as Au, Al, Cu, or the like.

b'. Operation of Covering Bonding Pad with Pad Protection Unit

As shown in FIG. 28B, a pad protection unit 620' may be provided to cover the bonding pad 603' provided on the light emitting structure (S) to protect it. The pad protection unit 620' may have the same size as the bonding pad 603' such that the bonding pad 603' is not exposed upwardly. Here, the pad protection unit 620' may be made of photoresist, but the present invention is not limited thereto.

c'. Operation of Forming Wavelength Conversion Unit Having Certain Thickness by Applying Resin Material to Light Emitting Structure As shown in FIG. 28C, a transparent resin such as silicon, epoxy, or the like, is printed to have a certain thickness on the light emitting structure (S) such that the light emitting structure (S) with the pad protection units 620' formed on the bonding pads 603' are covered by the resin material, through a printing method to form wavelength conversion units 602'.

The wavelength conversion units 602' printed on the light emitting structure (S) to cover the entire upper surface of the light emitting structure (S) including the bonding pads 603' are cured by artificially provided heat or UV light.

Here, the resin material used for forming the wavelength conversion unit 602' may include a phosphor material as a light wavelength conversion means for converting the wavelength of a light emission color of each LED chip 601' in order to convert a light emission color into white light according to the light emission color of each LED 601' configured by the light emitting structure (S) when each LED chip 601' emits light.

d'. Operation of Removing Upper Surface of Wavelength Conversion Unit to Expose Pad Protection Unit As shown in FIG. 28D, when the wavelength conversion unit 602 provided to cover the light emitting structure (S) formed on the wafer (W') is exposed to light irradiated from above, the uppermost surface of the wavelength conversion unit 602' is etched to be removed, exposing the pad protection unit 620'. Here, irradiation of light to the upper surface of the wavelength conversion unit 602' should be stopped immediately when the upper surface of the pad protection unit 620' is exposed.

Also, in a different method of partially removing the wavelength conversion unit 602' to expose the pad protection unit 620', a portion of the upper surface of the wavelength conversion unit 602' may be removed by using a polishing unit. Namely, the resin material may be removed by polishing the wavelength conversion unit 602' through a polishing method using a grinder or a cutting method using a fly cutter, thus exposing the pad protection unit 620' provided on the light emitting structure (S).

e'. Operation of Removing Pad Protection Unit Exposed from Wavelength Conversion Unit As shown in FIG. 28E, when the pad protection unit 620' exposed from the upper surface of the wavelength conversion unit 602' is removed to be separated from the bonding pad 603' and the wavelength conversion unit 602', a space tantamount to the removed pad protection unit 620' is formed at an upper portion of the wavelength conversion unit 602' and, at the same time, the bonding pad 603' is exposed.

f'. Operation of Cutting Wafer with Light Emitting Structure Formed Thereon

Subsequently, as shown in FIG. 28F, the light emitting structure (S) with the bonding pad 603' exposed to the outside is cut together with the wafer (W') along vertical and horizontal cutting lines demarcated on an upper surface thereof, thus being fabricated into an LED device 600' which generates light when power is applied thereto.

The LED device 600' includes an LED chip 601' including the light emitting structure (S), at least one bonding pad 603' provided on the upper surface of the LED chip 601', and the wavelength conversion unit 602' uniformly covering the upper surface of the LED chip 601', while exposing the bonding pad 603'.

Figure 29A:
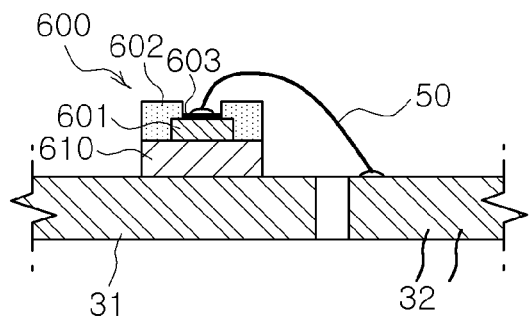
FIGS. 29A and 29B are views schematically illustrating a state in which the LED device fabricated according to the processes of FIGS. 27 and 28 are mounted on a lead frame.
Figure 29B:
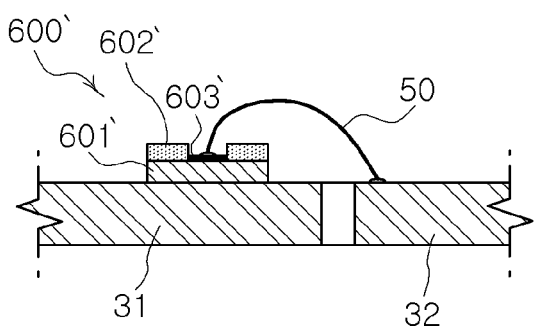

As shown in FIGS. 29A and 29B, the LED devices 600 and 600' having such a configuration are mounted on an upper surface of one lead frame 31 having a positive electrode lead and a negative electrode lead and may be electrically connected to another lead frame 32 by the medium of the wire 50 having one end bonded to the bonding pads 603 and 603' exposed through the wavelength conversion units 602 and 602'. In this case, the wire 50 may be connected to the bonding pads 603 and 603' exposed through the wavelength conversion units 602 and 602', rather than being in contact with the wavelength conversion units 602 and 602'.

In the present embodiment, the wavelength conversion units 602 and 602' including phosphor materials are formed to have a uniform thickness evenly on the outer surfaces of the LED chips 601 and 601', whereby a path along which light generated from the LED chips 601 and 601' passes through the wavelength conversion units 602 and 602' is uniform according to irradiation angles, and thus, a difference in color temperature according to irradiation angles can be prevented.

Also, the wire 50 is basically prevented from being in contact with the phosphor materials made of heavy metal having electric conductivity included in the wavelength conversion units 602 and 602', preventing a generation of a leakage current. Thus, luminous efficiency of the LED devices 600 and 600' can be enhanced and degradation characteristics are prevented from deteriorating, thus increasing reliability of the product.

Figure 31:
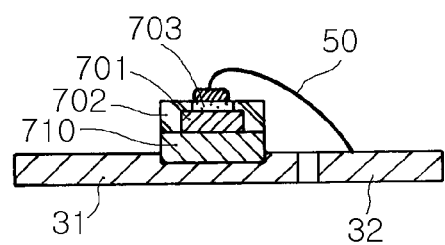
FIG. 31 is a view schematically illustrating a state in which an LED device fabricated according to the process of FIG. 30 is mounted on a lead frame.

An LED device according to another embodiment of the present invention will be described with reference to FIGS. 30 and 31. FIGS. 30A to 30E are views schematically illustrating sequential processes of fabricating an LED device according to another embodiment of the present invention.

First, as shown in FIG. 30A, LED chips 701 fabricated through a semiconductor fabrication process are mounted to be spaced apart from each other on the wafer (W) in a die-attachment manner. Here, the wafer (W) may be made of one selected from among a non-conductive material and a conductive material according to a disposition configuration of a p-type electrode and an n-type electrode provided in the LED chips 701.

Next, as shown in FIG. 30B, a plurality of bonding pads 703 are formed on upper surfaces of the LED chips 701 die-attached to the wafer (W). Here, a single bonding pad 703 or a plurality thereof may be provided according to a disposition form (vertical type or a horizontal type) of the p-type electrode and the n-type electrode provided in the LED chips 701.

Then, as shown in FIG. 30C, a transparent resin such as silicon, epoxy, or the like, is printed to have a certain thickness on the wafer (W) such that the plurality of LED chips 71 including the bonding pads 703 formed on an upper surface thereof are covered by the resin material, through a printing method to form a wavelength conversion unit 702.

The wavelength conversion unit 702 printed on the wafer (W) to cover the LED chips 701 including the bonding pads 703 is cured by artificially provided heat or UV light. Here, the wavelength conversion unit 702 may include a phosphor material as a light wavelength conversion means for converting the wavelength of a light emission color of each LED chip 701 in order to convert a light emission color of each LED 701 into white light according to the light emission color of each LED 701.

Thereafter, as shown in FIG. 30D, the upper surface of the wavelength conversion unit 702 provided on the wafer (W) is polished by a polishing unit (not shown) to expose the bonding pads 703 provided on the LED chips 701. In this case, in order to polish the upper surface of the wavelength conversion unit 702, a polishing method using a grinder or a cutting method using a fly cutter, or the like, may be used to obtain uniformity in the surface of the wavelength conversion unit 702, and here, a polishing method may be selected in consideration of precision and productivity. Here, after being polished by the polishing unit, preferably, the wavelength conversion unit 702 has a uniform layer thickness such that an upper surface thereof is parallel to the wafer (W).

Subsequently, as shown in FIG. 30E, the LED chip 701 with the wavelength conversion unit 702 which has been polished to expose the bonding pad 703 to the outside is cut along vertical and horizontal cutting lines formed between an adjacent LED chip 601, thus being fabricated as an LED device 700 that generates light when power is applied thereto.

The LED device 700 includes the LED chip 701 die-attached to the sub-mount 710 after being cut from the wafer (W), at least one bonding pad 703 provided on the upper surface of the LED chip 701, and the wavelength conversion unit 702 uniformly covering the outer surface of the LED chip 701, while exposing the bonding pad 703.

The LED device 700 having the foregoing configuration is mounted on one upper surface of one lead frame 31 having a positive electrode lead and a negative electrode lead and may be electrically connected to another lead frame 32 by the medium of the wire 50 having one end bonded to the bonding pad 703

As set forth above, according to embodiments of the invention, since the lens support unit is formed to be higher than the wire of the package main body, the wire can be prevented from being damaged, thus enhancing operation reliability of the product.

While the present invention has been shown and described in connection with the embodiments, it will be apparent to those skilled in the art that modifications and variations can be made without departing from the spirit and scope of the invention as defined by the appended claims.

What is claimed is:

1. A light emitting device package comprising:
a package main body having side walls and a chip mounting region surrounded by the side walls;
lead frames spaced apart from one another, at least one portion thereof being positioned in the chip mounting region;
a light emitting device mounted on the chip mounting region;
a wire connecting the lead frame and the light emitting device;
a lens disposed on the light emitting device; and
a lens support unit formed to be higher than the wire in the chip mounting region and supporting the lens such that the lens does not come into contact with the wire,
wherein the lens support unit includes a plurality of parts extending from the side walls toward the light emitting device.
wherein the lens has a flat upper surface and a convex lower portion forming a reflector protruded from a lower portion of the lens, and
wherein the lens support unit supports a lower end portion of the reflector mounted thereon.

2. The package of claim 1, wherein the lens support unit is formed on at least one portion among remaining portions after the light emitting device is mounted on the chip mounting region.

3. The package of claim 1, wherein the lens support unit has a stopping protuberance allowing a lower end portion of the lens to be caught thereby.

4. The package of claim 3, wherein the stopping protuberance has a hemispherical shape.

5. The package of claim 3, wherein the stopping protuberance has a square pillar shape.

6. The package of claim 1, wherein each of the plurality of parts has an opening hole disposed in an upper space of the chip mounting region.

7. The package of claim 1, wherein at least one lens support unit extends from one side of the side walls and traverses the chip mounting region so as to be connected to the other side.

8. The package of claim 7, wherein a plurality of lens support units intersect each other in the chip mounting region.

9. The package of claim 1, wherein a lower surface of the lens support unit is positioned to be higher than the wire.

10. The package of claim 1, wherein the side wall has at least one support protuberance, and the lens has at least one horizontal protrusion formed on an outer circumference thereof and supported by the support protuberance.

11. The package of claim 1, wherein the side wall has at least one indentation formed in an upper edge thereof, and the lens has at least one insertion projection formed on an upper edge thereof such that it corresponds to the indentation in the side wall.

12. The package of claim 1, wherein the package main body includes a support protuberance formed on an inner side of the side wall and a recess portion having the chip mounting region at an inner side of the support protuberance, wherein the recess portion is formed to have a depth from which the wire is not protruded upwardly and an upper surface of the support protuberance is positioned to be higher than the wire.

13. The package of claim 12, wherein one portion of the lens support unit is fixedly placed on the support protuberance, and the other remaining portion is placed over the recess portion and disposed above the chip mounting region.

14. The package of claim 13, wherein a lower surface of the lens support unit is coplanar with an upper surface of the support protuberance.

15. The package of claim 12, further comprising an encapsulation unit filling the recess portion to encapsulate the light emitting device and the wire.

16. The package of claim 15, wherein the encapsulation unit contains at least one type of phosphor.

17. The package of claim 1, wherein the lens is formed such that an upper surface thereof is flat and a lower portion thereof is protuberant.

18. The package of claim 17, wherein the lens is formed such that a lower surface thereof is flat.

19. The package of claim 18, wherein the lens is formed such that a lower surface thereof has a Fresnel lens shape.

\* \* \* \* \*